(12) United States Patent
Bykanov et al.

(10) Patent No.: US 7,812,329 B2
(45) Date of Patent: Oct. 12, 2010

(54) SYSTEM MANAGING GAS FLOW BETWEEN CHAMBERS OF AN EXTREME ULTRAVIOLET (EUV) PHOTOLITHOGRAPHY APPARATUS

(75) Inventors: Alexander N. Bykanov, San Diego, CA (US); David C. Brandt, Escondido, CA (US); Igor V. Fomenkov, San Diego, CA (US); William N. Partlo, Poway, CA (US)

(73) Assignee: Cymer, Inc., San Diego, CA (US)

( * ) Notice: Subject to any disclaimer, the term of this patent is extended or adjusted under 35 U.S.C. 154(b) by 236 days.

(21) Appl. No.: 12/002,073

(22) Filed: Dec. 14, 2007

(65) Prior Publication Data

US 2009/0154642 A1    Jun. 18, 2009

(51) Int. Cl.
*G21K 5/00* (2006.01)
(52) U.S. Cl. .............. 250/504 R; 250/493.1; 250/492.2; 378/34; 315/111.01; 315/111.21
(58) Field of Classification Search .............. 250/493.1, 250/504 R, 492.1, 497.1, 503.1; 313/111.01, 313/111.21, 111.31, 111.71; 378/122, 123, 378/140, 34; 315/111.01, 111.11, 111.21, 315/111.31, 111.41, 111.71, 111.81, 111.91
See application file for complete search history.

(56) References Cited

U.S. PATENT DOCUMENTS

| | | | |
|---|---|---|---|
| 4,223,279 A | 9/1980 | Bradford, Jr. et al. | 331/94.5 |
| 4,247,829 A | 1/1981 | Yagi et al. | 331/94 |
| 4,251,781 A | 2/1981 | Sutter, Jr. | 331/94 |
| 4,414,488 A | 11/1983 | Hoffmann et al. | 315/39 |
| 4,455,658 A | 6/1984 | Sutter et al. | 372/38 |
| 4,546,482 A | 10/1985 | Bagaglia et al. | 372/86 |

(Continued)

FOREIGN PATENT DOCUMENTS

EP    1434095 A1    6/2004

(Continued)

OTHER PUBLICATIONS

U.S. Appl. No. 11/786,145, filed Apr. 10, 2007, Bykanov et al.

(Continued)

*Primary Examiner*—Jack I Berman
*Assistant Examiner*—Nicole Ippolito Rausch
(74) *Attorney, Agent, or Firm*—Matthew K. Hillman

(57) ABSTRACT

A gas flow management system may comprise a first and second enclosing walls at least partially surrounding first and second respective spaces; a system generating plasma in the first space, the plasma emitting extreme ultraviolet light; an elongated body restricting flow from the first space to the second space, the body at least partially surrounding a passageway and having a first open end allowing EUV light to enter the passageway from the first space and a second open end allowing EUV light to exit the passageway into the second space, the body shaped to establish a location having a reduced cross-sectional area relative to the first and second ends; and a flow of gas exiting an aperture, the aperture positioned to introduce gas into the passageway at a position between the first end of the body and the location having a reduced cross-sectional area.

21 Claims, 9 Drawing Sheets

U.S. PATENT DOCUMENTS

| | | |
|---|---|---|
| 4,686,682 A | 8/1987 | Haruta et al. ............... 372/87 |
| 4,703,490 A | 10/1987 | Brumme et al. ............. 372/86 |
| 4,742,527 A | 5/1988 | Wiedemann et al. ......... 372/87 |
| 4,774,714 A | 9/1988 | Javan ...................... 372/109 |
| 4,860,300 A | 8/1989 | Baumler et al. ............. 372/57 |
| 4,876,693 A | 10/1989 | Lucero et al. ............... 372/82 |
| 4,953,174 A | 8/1990 | Eldridge et al. ............. 372/87 |
| 4,959,840 A | 9/1990 | Akins et al. ................ 372/57 |
| 5,023,884 A | 6/1991 | Akins et al. ................ 372/57 |
| 5,025,445 A | 6/1991 | Anderson et al. ........... 372/20 |
| 5,025,446 A | 6/1991 | Kuizenga .................. 372/21 |
| 5,048,041 A | 9/1991 | Akins et al. ................ 372/57 |
| 5,070,513 A | 12/1991 | Letardi ..................... 372/83 |
| 5,187,716 A | 2/1993 | Haruta et al. ............... 372/57 |
| 5,189,678 A | 2/1993 | Ball et al. .................. 372/28 |
| 5,247,534 A | 9/1993 | Muller-Horsche ........... 372/58 |
| 5,313,481 A | 5/1994 | Cook et al. ................. 372/37 |
| 5,315,611 A | 5/1994 | Ball et al. .................. 372/56 |
| 5,359,620 A | 10/1994 | Akins et al. ................ 372/58 |
| 5,448,580 A | 9/1995 | Birx et al. .................. 372/38 |
| 5,471,965 A | 12/1995 | Kapich ..................... 123/565 |
| 5,535,233 A | 7/1996 | Mizoguchi et al. .......... 372/87 |
| 5,557,629 A | 9/1996 | Mizoguchi et al. .......... 372/87 |
| 5,646,954 A | 7/1997 | Das et al. ................... 372/25 |
| 5,729,565 A | 3/1998 | Meller et al. ................ 372/87 |
| 5,763,930 A | 6/1998 | Partlo ...................... 250/504 R |
| 5,771,258 A | 6/1998 | Morton et al. .............. 372/57 |
| 5,852,621 A | 12/1998 | Sandstrom .................. 372/25 |
| 5,863,017 A | 1/1999 | Larson et al. .............. 248/176.1 |
| 5,875,207 A | 2/1999 | Osmanow ................... 372/86 |
| 5,940,421 A | 8/1999 | Partlo et al. ................ 372/38 |
| 5,953,360 A | 9/1999 | Vitruk et al. ................ 372/87 |
| 6,005,879 A | 12/1999 | Sandstrom et al. .......... 372/25 |
| 6,016,325 A | 1/2000 | Ness et al. ................. 372/38 |
| 6,018,537 A | 1/2000 | Hofmann et al. ............ 372/25 |
| 6,028,880 A | 2/2000 | Carlesi et al. ............... 372/58 |
| 6,034,978 A | 3/2000 | Ujazdowski et al. ......... 372/34 |
| 6,051,841 A | 4/2000 | Partlo ...................... 250/504 R |
| 6,064,072 A | 5/2000 | Partlo et al. ................ 250/504 R |
| 6,067,311 A | 5/2000 | Morton et al. .............. 372/57 |
| 6,094,448 A | 7/2000 | Fomenkov et al. ........... 372/102 |
| 6,104,735 A | 8/2000 | Webb ...................... 372/37 |
| 6,109,574 A | 8/2000 | Pan et al. .................. 248/176.1 |
| 6,128,323 A | 10/2000 | Myers et al. ................ 372/38 |
| 6,151,349 A | 11/2000 | Gong et al. ................. 372/58 |
| 6,164,116 A | 12/2000 | Rice et al. .................. 73/1.72 |
| 6,192,064 B1 | 2/2001 | Algots et al. ................ 372/99 |
| 6,208,674 B1 | 3/2001 | Webb et al. ................ 372/58 |
| 6,208,675 B1 | 3/2001 | Webb ...................... 372/58 |
| 6,212,211 B1 | 4/2001 | Azzola et al. ............... 372/23 |
| 6,219,368 B1 | 4/2001 | Govorkov ................... 372/59 |
| 6,240,117 B1 | 5/2001 | Gong et al. ................. 372/58 |
| 6,317,447 B1 | 11/2001 | Partlo et al. ................ 372/57 |
| 6,359,969 B1 | 3/2002 | Shmaenok ................. 378/156 |
| 6,414,979 B2 | 7/2002 | Ujazdowski et al. ......... 372/87 |
| 6,452,199 B1 | 9/2002 | Partlo et al. ................ 250/504 R |
| 6,466,602 B1 | 10/2002 | Fleurov et al. .............. 372/87 |
| 6,477,193 B2 | 11/2002 | Oliver et al. ................ 372/58 |
| 6,493,374 B1 | 12/2002 | Fomenkov et al. ........... 372/102 |
| 6,541,786 B1 | 4/2003 | Partlo et al. ................ 250/504 R |
| 6,549,551 B2 | 4/2003 | Ness et al. ................. 372/38.07 |
| 6,556,612 B2 | 4/2003 | Ershov et al. ............... 372/103 |
| 6,567,450 B2 | 5/2003 | Myers et al. ................ 372/55 |
| 6,576,912 B2 | 6/2003 | Visser et al. ................ 250/492.2 |
| 6,614,505 B2 | 9/2003 | Koster et al. ............... 355/30 |
| 6,618,421 B2 | 9/2003 | Das et al. ................... 372/55 |
| 6,625,191 B2 | 9/2003 | Knowles et al. ............. 372/55 |
| 6,635,844 B2 | 10/2003 | Yu ......................... 219/121.68 |
| 6,693,939 B2 | 2/2004 | Klene et al. ................ 372/58 |
| 6,782,031 B1 | 8/2004 | Hofmann et al. ............ 372/90 |
| 6,815,700 B2 | 11/2004 | Melnychuk et al. ......... 250/504 R |
| 6,928,093 B2 | 8/2005 | Webb et al. ................ 372/25 |
| 6,972,421 B2 | 12/2005 | Melnychuk et al. ......... 250/504 R |
| 6,987,279 B2 | 1/2006 | Hoshino et al. ............. 250/504 R |
| 7,002,168 B2 | 2/2006 | Jacob et al. ................. 250/504 R |
| 7,026,629 B2 | 4/2006 | Bakker et al. .............. 250/423 P |
| 7,068,697 B1 | 6/2006 | Amada et al. ............... 372/58 |
| 7,087,914 B2 | 8/2006 | Akins et al. ................ 250/504 R |
| 7,135,693 B2 | 11/2006 | Roux ...................... 250/492.2 |
| 7,136,141 B2 | 11/2006 | Bakker ..................... 355/30 |
| 7,164,144 B2 | 1/2007 | Partlo et al. ................ 250/504 R |
| 7,196,342 B2 | 3/2007 | Ershov et al. ............... 250/504 R |
| 7,217,940 B2 | 5/2007 | Partlo et al. ................ 250/504 R |
| 7,217,941 B2 | 5/2007 | Rettig et al. ................ 250/504 R |
| 7,230,258 B2 | 6/2007 | Ruzic et al. ................. 250/504 R |
| 7,251,012 B2 | 7/2007 | Banine et al. ............... 355/30 |
| 7,271,401 B2 | 9/2007 | Imai et al. .................. 250/504 R |
| 7,315,346 B2 | 1/2008 | Van Beek et al. ............ 355/30 |
| 7,361,918 B2 | 4/2008 | Akins et al. ................ 250/504 R |
| 7,365,349 B2 | 4/2008 | Partlo et al. ................ 250/504 R |
| 7,368,741 B2 | 5/2008 | Melnychuk et al. ......... 250/504 R |
| 7,372,056 B2 | 5/2008 | Bykanov et al. ............ 250/504 R |
| 7,378,673 B2 | 5/2008 | Bykanov et al. ............ 250/503.1 |
| 7,394,083 B2 | 7/2008 | Bowering et al. ........... 250/504 R |
| 7,405,416 B2 | 7/2008 | Algots et al. ............... 250/493.1 |
| 7,415,056 B2 | 8/2008 | Das et al. ................... 372/55 |
| 2003/0006383 A1* | 1/2003 | Melnychuk et al. ......... 250/504 R |
| 2004/0023253 A1 | 2/2004 | Kunwar et al. .............. 435/6 |
| 2005/0259709 A1 | 11/2005 | Das et al. ................... 372/55 |
| 2006/0012761 A1 | 1/2006 | Bakker et al. ............... 355/30 |
| 2006/0175558 A1 | 8/2006 | Bakker et al. ............... 250/492.2 |
| 2006/0219957 A1 | 10/2006 | Ershov et al. ............... 250/504 R |
| 2006/0249699 A1 | 11/2006 | Bowering et al. ........... 250/504 R |
| 2006/0250599 A1 | 11/2006 | Bakker et al. ............... 355/67 |
| 2006/0255298 A1 | 11/2006 | Bykanov et al. ............ 250/504 R |
| 2006/0268246 A1 | 11/2006 | Jacobs et al. ............... 355/30 |
| 2007/0001131 A1 | 1/2007 | Ershov et al. ............... 250/503.1 |
| 2007/0018119 A1* | 1/2007 | Yabuta et al. ............... 250/493.1 |
| 2007/0023709 A1* | 2/2007 | Kanazawa et al. .......... 250/504 R |
| 2007/0102653 A1 | 5/2007 | Bowering et al. ........... 250/504 R |
| 2007/0145297 A1 | 6/2007 | Freriks et al. ............... 250/492.2 |
| 2007/0158594 A1 | 7/2007 | Shirai et al. ................ 250/504 R |
| 2007/0228298 A1 | 10/2007 | Komori et al. .............. 250/493.1 |
| 2007/0291279 A1 | 12/2007 | Rafac ...................... 356/508 |
| 2007/0291350 A1 | 12/2007 | Ershov et al. ............... 359/333 |
| 2008/0017801 A1* | 1/2008 | Fomenkov et al. .......... 250/354.1 |
| 2008/0043321 A1 | 2/2008 | Bowering et al. ........... 359/359 |
| 2008/0048133 A1 | 2/2008 | Bykanov et al. ............ 250/504 R |
| 2008/0087847 A1 | 4/2008 | Bykanov et al. ............ 250/504 R |
| 2008/0149862 A1 | 6/2008 | Hansson et al. ............. 250/504 R |
| 2009/0135386 A1* | 5/2009 | Nishikawa ................. 355/30 |

FOREIGN PATENT DOCUMENTS

| | | |
|---|---|---|
| EP | 1674932 A1 | 1/2008 |
| JP | 2006-329664 | 12/2006 |
| JP | 2007-220949 | 8/2007 |
| JP | 2007-317598 | 12/2007 |

OTHER PUBLICATIONS

U.S. Appl. No. 11/827,803, filed Jul. 13, 2007, Vaschenko.
U.S. Appl. No. 11/897,644, filed Aug. 31, 2007, Bykanov et al.
Harilal, et al., "Ion debris mitigation from tin plasma using ambient gas, magnetic field and combined effects," J. Appl. Phys. B—Lasers and Optics, pp. 1-7; *Center for Energy Research, Univ. of Calif.*, San Diego (2006).
Harilal, et al., "Spectroscopic characterization of laser-induced tin plasma," J. of Appl. Phys. 98 (1), 013306, pp. 1-7, *Univ. of Calif. Postprints*, paper 857 (2005).
Harilal, et al., "Debris mitigation in a laser-produced tin plume using a magnetic field," J. of App. Phys., 98, 036102, pp. 1-3, *American Institute of Physics* (2005).

Harilal, et al., "Ambient gas effects on the dynamics of laser-produced tin plume expansion," J. of App. Physics, 99, 083303, pp. 1-10, *American Institute of Physics* (2006).

Hershcovitch, "High-pressure arcs as vacuum-atmosphere interface and plasma lens for nonvacuum electron beam welding machines, electron beam melting, and nonvacuum ion material modification," J. Appl. Phys. 78 (9), pp. 5283-5288, *American Institute of Physics* (1995).

Tao, et al., "Mitigation of fast ions from laser-produced Sn plasma for an extreme ultraviolet lithography source," in App. Physics Letters 89, 111502, *American Institute of Physics* (2006).

Tao, et al., "Characterizing and optimizing the density profile of double-pulse laser-produced Sn-based plasmas to enhance conversion efficiency and mitigate debris for an EUVL source," Center for Energy Research, Univ. of Calif., UCSD-CER-05-07 (2005).

Tao, et al., "A mass-limited Sn target irradiated by dual laser pulses for an extreme ultraviolet lithography source," in Optics Lett., Doc ID: 78008, pp. 1-12 (2007).

\* cited by examiner

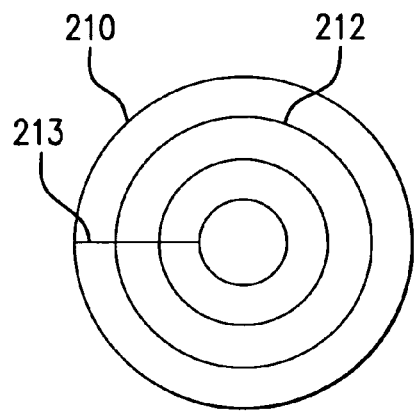
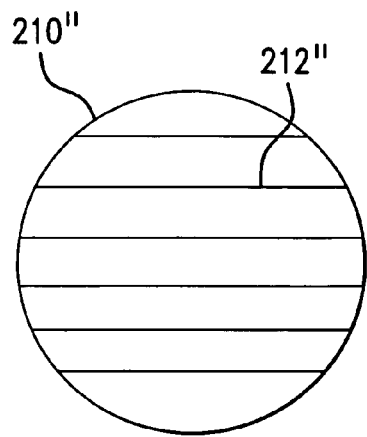
FIG.2A
FIG.2B
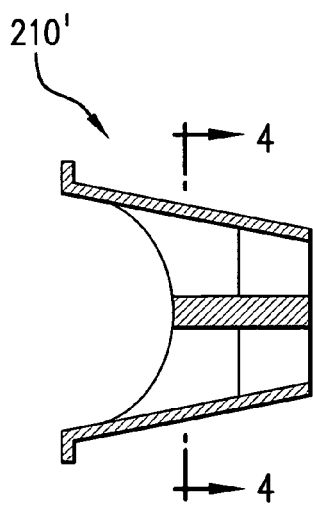
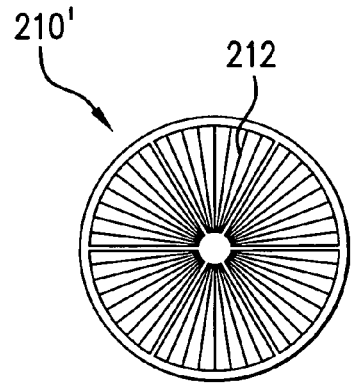
FIG.3
FIG.4

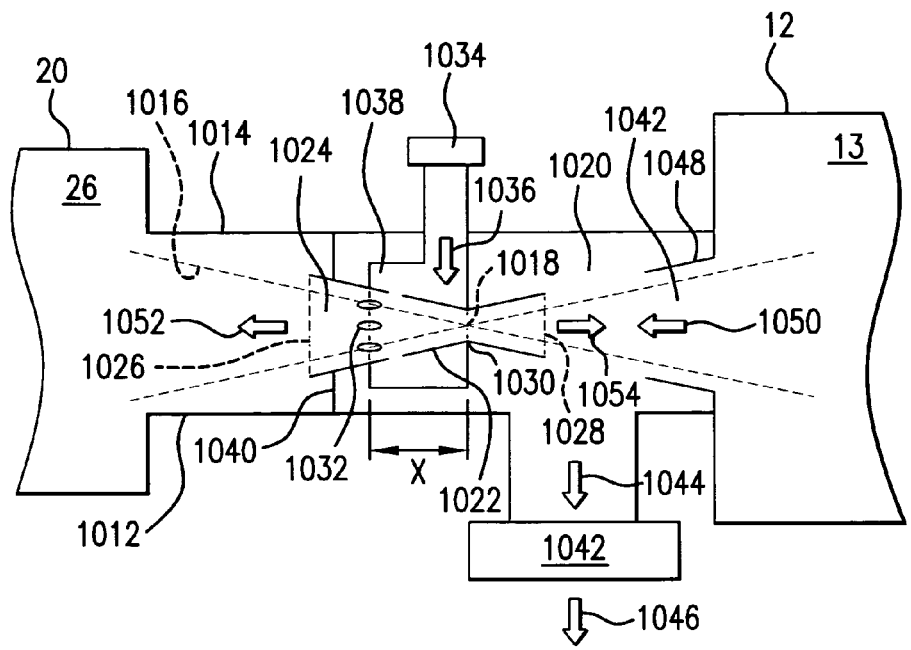
FIG.5
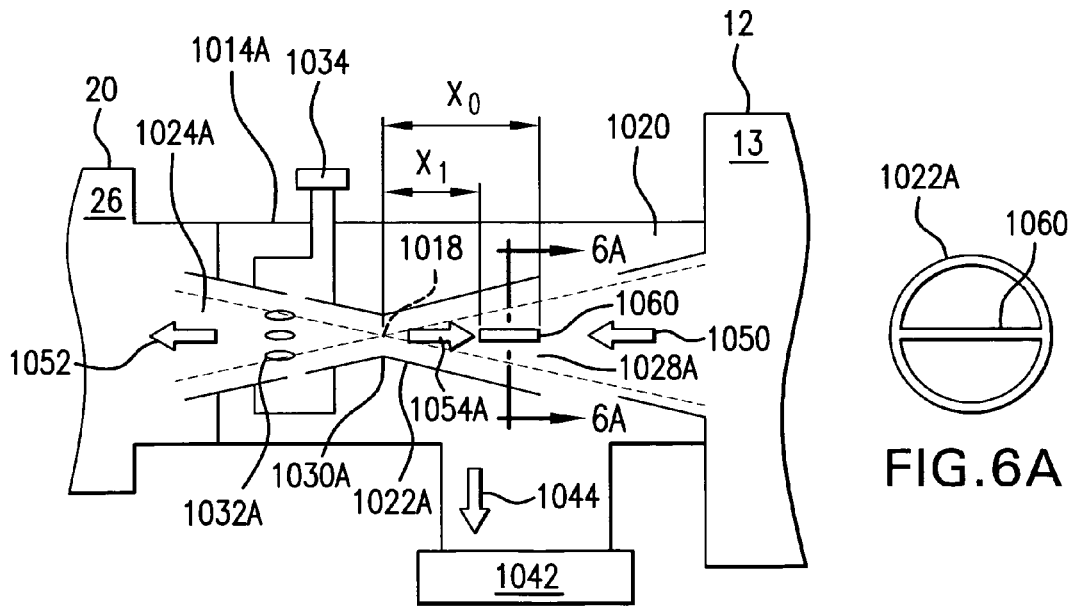
FIG.6
FIG.6A

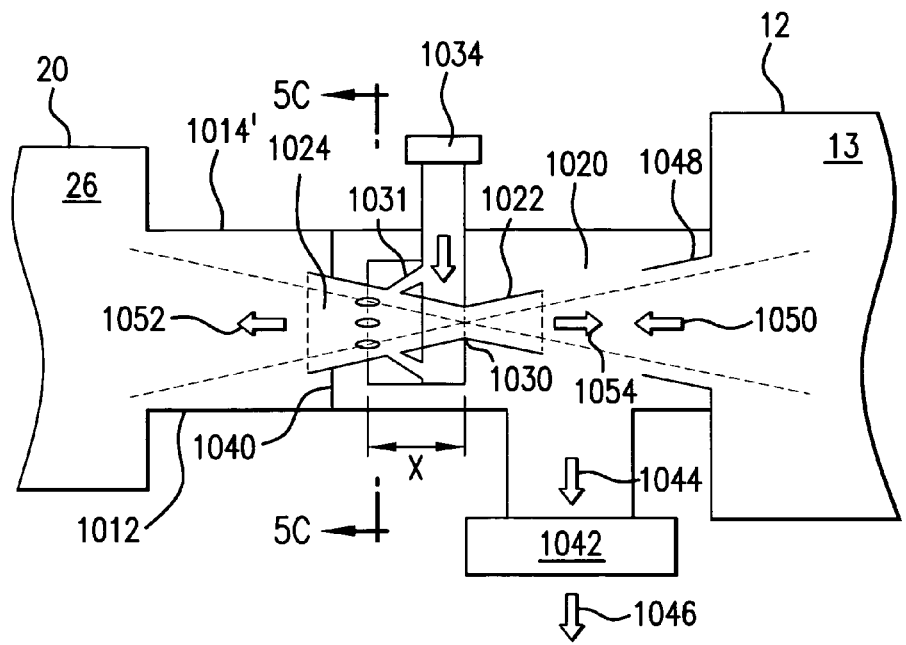
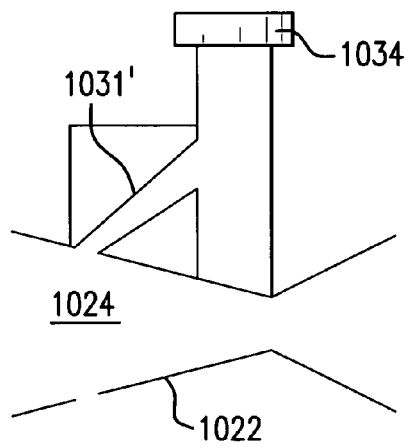
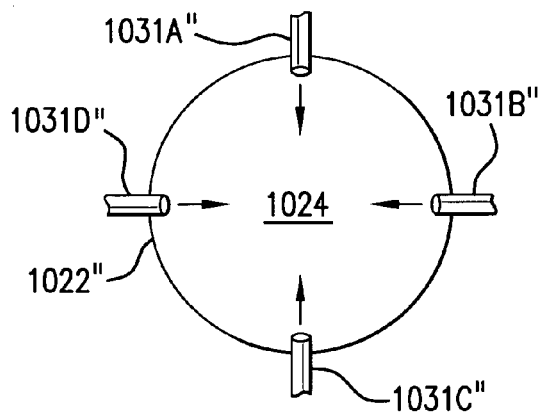
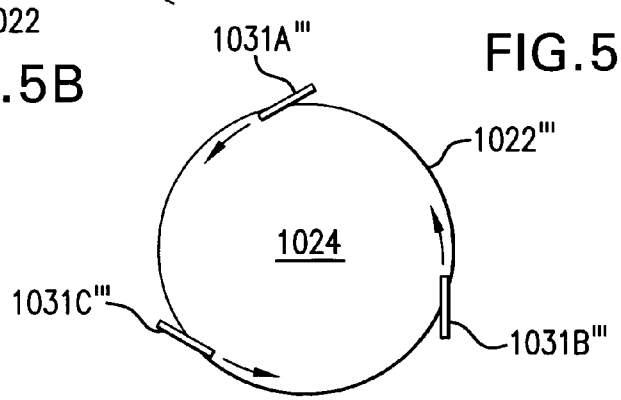
FIG.5A
FIG.5B
FIG.5C
FIG.5D

SYSTEM MANAGING GAS FLOW BETWEEN CHAMBERS OF AN EXTREME ULTRAVIOLET (EUV) PHOTOLITHOGRAPHY APPARATUS

The present application is related to U.S. Pat. No. 6,972,421 issued on Dec. 6, 2005, and entitled, EXTREME ULTRAVIOLET LIGHT SOURCE, co-pending U.S. patent application Ser. No. 11/897,664 filed on Aug. 31, 2007, entitled GAS MANAGEMENT SYSTEM FOR A LASER PRODUCED PLASMA EUV LIGHT SOURCE, co-pending U.S. patent application Ser. No. 11/323,397 filed on Dec. 29, 2005, entitled EUV LIGHT SOURCE, co-pending U.S. patent application Ser. No. 11/358,992 filed on Feb. 21, 2006, entitled LASER PRODUCED PLASMA EUV LIGHT SOURCE, co-pending U.S. patent application Ser. No. 11/827,803 filed on Jul. 13, 2007, entitled LASER PRODUCED PLASMA EUV LIGHT SOURCE HAVING A DROPLET STREAM PRODUCED USING A MODULATED DISTURBANCE WAVE, co-pending U.S. patent application Ser. No. 11/786,145 filed on Apr. 10, 2007, entitled LASER PRODUCED PLASMA EUV LIGHT SOURCE, co-pending U.S. patent application Ser. No. 11/107,535 filed on Apr. 14, 2005, entitled EXTREME ULTRAVIOLET LIGHT SOURCE, which is a continuation of U.S. patent application Ser. No. 10/409,254 filed on Apr. 8, 2003, entitled EXTREME ULTRAVIOLET LIGHT SOURCE, co-pending U.S. patent application Ser. No. 11/358,988 filed on Feb. 21, 2006, entitled LASER PRODUCED PLASMA EUV LIGHT SOURCE WITH PRE-PULSE, co-pending U.S. patent application Ser. No. 11/067,124 filed on Feb. 25, 2005, entitled METHOD AND APPARATUS FOR EUV PLASMA SOURCE TARGET DELIVERY, co-pending U.S. patent application Ser. No. 11/174,443 filed on Jun. 29, 2005, entitled LPP EUV PLASMA SOURCE MATERIAL TARGET DELIVERY SYSTEM, co-pending U.S. SOURCE MATERIAL DISPENSER FOR EUV LIGHT SOURCE, co-pending U.S. patent application Ser. No. 11/358,992 filed on Feb. 21, 2006, entitled LASER PRODUCED PLASMA EUV LIGHT SOURCE, co-pending U.S. patent application Ser. No. 11/174,299 filed on Jun. 29, 2005, and entitled, LPP EUV LIGHT SOURCE DRIVE LASER SYSTEM, co-pending U.S. patent application Ser. No. 11/406,216 filed on Apr. 17, 2006 entitled ALTERNATIVE FUELS FOR EUV LIGHT SOURCE, co-pending U.S. patent application Ser. No. 11/580,414 filed on Oct. 13, 2006 entitled, DRIVE LASER DELIVERY SYSTEMS FOR EUV LIGHT SOURCE, and co-pending U.S. patent application Ser. No. 11/644,153 filed on Dec. 22, 2006 entitled, LASER PRODUCED PLASMA EUV LIGHT SOURCE, co-pending U.S. patent application Ser. No. 11/505,177 filed on Aug. 16, 2006, entitled EUV OPTICS, co-pending U.S. patent application Ser. No. 11/452,588 filed on Jun. 14, 2006 entitled DRIVE LASER FOR EUV LIGHT SOURCE, co-pending U.S. Pat. No. 6,928,093, issued to Webb, et al. on Aug. 9, 2005, entitled LONG DELAY AND HIGH TIS PULSE STRETCHER, U.S. application Ser. No. 11/394,512, filed on Mar. 31, 2006 and titled CONFOCAL PULSE STRETCHER, U.S. application Ser. No. 11/138,001 filed on May 26, 2005 and titled SYSTEMS AND METHODS FOR IMPLEMENTING AN INTERACTION BETWEEN A LASER SHAPED AS A LINE BEAM AND A FILM DEPOSITED ON A SUBSTRATE, and U.S. application Ser. No. 10/141,216, filed on May 7, 2002, now U.S. Pat. No. 6,693,939, and titled, LASER LITHOGRAPHY LIGHT SOURCE WITH BEAM DELIVERY, U.S. Pat. No. 6,625,191 issued to Knowles et al on Sep. 23, 2003 entitled VERY NARROW BAND, TWO CHAMBER, HIGH REP RATE GAS DISCHARGE LASER SYSTEM, U.S. application Ser. No. 10/012,002, U.S. Pat. No. 6,549,551 issued to Ness et al on Apr. 15, 2003 entitled INJECTION SEEDED LASER WITH PRECISE TIMING CONTROL, U.S. application Ser. No. 09/848,043, and U.S. Pat. No. 6,567,450 issued to Myers et al on May 20, 2003 entitled VERY NAROW BAND, TWO CHAMBER, HIGH REP RATE GAS DISCHARGE LASER SYSTEM, U.S. application Ser. No. 09/943,343, co-pending U.S. patent application Ser. No. 11/509,925 filed on Aug. 25, 2006, entitled SOURCE MATERIAL COLLECTION UNIT FOR A LASER PRODUCED PLASMA EUV LIGHT SOURCE, the entire contents of each of which are hereby incorporated by reference herein.

FIELD

The present disclosure relates to extreme ultraviolet ("EUV") light sources which provide EUV light from a plasma that is created from a target material and collected and directed to an intermediate region for utilization outside of the EUV light source chamber, e.g. by a lithography scanner/stepper.

BACKGROUND

Extreme ultraviolet light, e.g., electromagnetic radiation having wavelengths of around 50 nm or less (also sometimes referred to as soft x-rays), and including light at a wavelength of about 13.5 nm, can be used in photolithography processes to produce extremely small features in substrates, e.g., silicon wafers. At this wavelength, nearly all known solid materials absorb a significant fraction of EUV light passing through the material. Thus, one generated, EUV light must be transmitted through vacuum of gas and reflected (since refracting lenses are generally unavailable) by mirrors (e.g. grazing incidence or near normal incidence multi-layer mirrors) along the entire path from the point of generation to the workpiece requiring exposure (e.g. wafer, flat panel, etc.)

Methods to produce EUV light include, but are not necessarily limited to, converting a material into a plasma state that has at least one element, e.g., xenon, lithium or tin, with one or more emission lines in the EUV range. These elements can include, but are not limited to xenon, tin, water, lithium.

In one such method, often termed laser-produced-plasma ("LPP") the required plasma can be produced by irradiating a target material, such as a droplet, stream or cluster of material having the required line-emitting element, with a laser beam. In some cases, other suitable energy beam (e.g. electron beam) may be used in place of the laser. In another method, often termed electric discharge-produced-plasma ("DPP"), the plasma may be produced by disposing a material having the required line-emitting element between a pair of electrodes and then generating an electrical discharge between the electrodes.

In more theoretical terms, LPP light sources generate EUV radiation by depositing laser energy into a source element, such as xenon (Xe), tin (Sn) or lithium (Li), creating a highly ionized plasma with electron temperatures of several 10's of eV. The energetic radiation generated during de-excitation and recombination of these ions is emitted from the plasma in all directions. In one common arrangement, a near-normal-incidence mirror (often termed a "collector mirror") having an ellipsoidal shape is positioned at a distance from the plasma to collect, direct (and in some arrangements, focus) the light to an intermediate location, e.g., focal point. The collected light may then be relayed from the intermediate location to a set of scanner optics and ultimately to a wafer. In a typical setup, the EUV light must travel within the light source about 1-2 m from the plasma to the intermediate location, and as a consequence, it may be advantageous, in certain circumstances, to limit the atmosphere in the light source chamber to gases having relatively low absorptance of in-band EUV light.

For EUV light sources designed for use in high volume manufacturing (HVM) environments, e.g. exposing 100 wafers per hour or more, the lifetime of the collector mirror can be a critical parameter affecting efficiency, downtime, and ultimately, cost. During operation, debris are generated as a by-product of the plasma which can degrade the collector mirror surface and other optics. These debris can be in the form of high-energy ions, neutral atoms and clusters of target material. Of these three types of debris, the most hazardous for the collector mirror coating is typically the ion flux. In the absence of debris mitigation and/or collector cleaning techniques, the deposition of target materials and contaminants, as well as sputtering of the collector multilayer coating and implantation of incident particles can reduce the reflectivity of the mirror substantially. In this regard, co-pending, co-owned U.S. patent application Ser. No. 11/786,145 filed on Apr. 10, 2007, entitled LASER PRODUCED PLASMA EUV LIGHT SOURCE, (the contents of which are hereby incorporated by reference herein) discloses a device in which a flowing buffer gas such as hydrogen at pressures at or above about 100 mTorr is used in the chamber to slow ions in the plasma to below about 30 eV before the ions reach the collector mirror, which is typically located about 15 cm from the plasma.

It is currently envisioned that about 100 W of EUV power, or more, will need to be delivered to a scanner/stepper to allow for efficient high volume EUV photolithography. To obtain this output power, a 5-20 kW drive laser, e.g. $CO_2$ laser, may be used to irradiate a source material such as a stream of tin droplets. Of the 5-20 kW of power delivered within the EUV light source chamber, calculations indicate that about 20%-80% of this power may be transferred to a buffer gas in the chamber.

Unlike the relatively harsh environment of the light source (which as indicated above may include debris, source material vapor and compounds, cleaning etchants such as HBr, ion slowing buffer gas(es) such as hydrogen, (which may be at relatively high pressures and/or relatively high flow rates), heat, etc.,) the environment within the stepper/scanner is typically more benign. Indeed, within the chamber of a stepper/scanner (which typically includes complex optics to establish illumination, patterning and projection as well as complex mechanical arrangements to move the wafer stage relative to the patterning optics, e.g. reticle), a near vacuum environment which is nearly completely free of the debris, gas(es), pressures and/or heat which may be found in the light source chamber, is desirable. However, as indicated above, solid, non EUV absorbing materials are unavailable to establish a suitable barrier between, e.g. a light source chamber and scanner optics chamber, and, as a consequence, more complex arrangements must be developed to separate these environments while still passing EUV light from one chamber to another.

With the above in mind, applicants disclose systems for managing gas flow between chambers of an extreme ultraviolet (EUV) photolithography apparatus, and corresponding methods of use.

SUMMARY

In a first aspect, a flow management system for an extreme ultraviolet lithography apparatus is described herein which may comprise a first enclosing wall at least partially surrounding a first space; a system generating plasma in the first space, the plasma emitting extreme ultraviolet light; a second enclosing wall at least partially surrounding a second space; an elongated body restricting flow from the first space to the second space, the body at least partially surrounding a passageway and having a first open end allowing EUV light to enter the passageway from the first space and a second open end allowing EUV light to exit the passageway into the second space, the body shaped to establish a location having a reduced cross-sectional area relative to the first and second ends; and a flow of gas exiting an aperture, the aperture positioned to introduce gas into the passageway at a position between the first end of the body and the location having a reduced cross-sectional area.

In one embodiment of this aspect, the system may further comprise a source generating an electromagnetic field in the passageway to produce a plasma therein. For example, the source may comprise a radio-frequency coil for creating an inductively coupled discharge plasma in the passageway and/or the source may produce a direct current electrode discharge in the passageway. For this aspect, the plasma may be a glow discharge or a corona discharge plasma. In another setup, the source may produce a radio-frequency electrode discharge in the passageway which may be a glow discharge or corona discharge.

In one arrangement of this aspect, the aperture may comprise a hole formed in the elongated body, and in a particular arrangement, the system may comprise a plurality of apertures, each aperture positioned to introduce gas into the passageway at a respective position between the first end of the body and the location having a reduced cross-sectional area. In one setup, the system may comprise one or more nozzles directing flow from the aperture(s) toward the first end of the elongated body.

In a particular embodiment of this aspect, a temperature control system may be provided maintaining the temperature of the elongated body within a predetermined range.

In one embodiment of this aspect, at least one vane may be disposed in the passageway of the elongated body.

In another aspect of the present disclosure, an extreme ultraviolet lithography apparatus may comprise a first chamber having gas disposed therein; a second chamber having gas disposed therein; an intermediary chamber in fluid communication with the second chamber; an elongated body restricting flow from the first chamber to the intermediary chamber, the body at least partially surrounding a passageway and having a first open end allowing EUV light to enter the passageway and a second open end allowing EUV light to exit the passageway; a flow of gas exiting an aperture, the aperture positioned to introduce gas into the passageway at a position between the first end and the second end of the body; and a pump removing gas from the intermediary chamber.

In one embodiment of this aspect, the pump may cooperate with the flow of gas exiting the aperture and the operational pressures within the first and second chambers to establish a gas flow directed from the second chamber into the intermediary chamber and a gas flow from the aperture through the first open end of the elongated body and into the first chamber.

In another aspect, an apparatus may comprise a first enclosing structure surrounding a first volume; a system generating a plasma at a plasma site in the first volume, the plasma producing EUV radiation and ions exiting the plasma; an optic positioned in the first volume and distanced from the site by a distance, d; a gas disposed between the plasma site and optic, the gas establishing a gas number density sufficient to operate over the distance, d, to reduce ion energy below 100 eV before the ions reach the optic; a second enclosing structure surrounding a second volume; and a system coupling the second volume to the first volume to allow EUV radiation to pass from the first volume to the second volume and operable to establish a gas flow directed from the second volume into the system and a gas flow from the system into the first volume.

In one embodiment of this aspect, a gas may be disposed in the first volume at a pressure $P_1$, a gas may be disposed in the second volume at a pressure $P_2$, with $P_1 > P_2$.

In a particular arrangement of this aspect, the system may comprise an intermediary chamber in fluid communication with the second volume; an elongated body restricting flow from the first volume to the intermediary chamber, the body at least partially surrounding a passageway and having a first open end allowing EUV light to enter the passageway and a second open end allowing EUV light to exit the passageway; a flow of gas exiting an aperture, the aperture positioned to introduce gas into the passageway at a location between the first end and the second end of the body; and a pump removing gas from the intermediary chamber.

In one implementation of this aspect, a multi-channel structure may be disposed in the first volume.

BRIEF DESCRIPTION OF THE DRAWINGS

FIG. 2A shows a sectional view through the multi-channel structure shown in FIG. 2 as seen along line 2A-2A in FIG. 2 showing a multi-channel structure having concentric, conical vanes;

FIG. 2B shows a sectional view through the multi-channel structure shown in FIG. 2 as seen along line 2A-2A in FIG. 2 showing a multi-channel structure having converging, flat plate vanes;

FIG. 3 shows an alternative arrangement for a multi-channel structure having a plurality of radially oriented vanes;

FIG. 4 shows a sectional view through the multi-channel structure shown in FIG. 3 as seen along line 4-4 in FIG. 3;

FIG. 5 shows an embodiment of a coupling system managing and/or limiting gas flow between the chamber of the light source and the chamber of a device, e.g. scanner, while allowing EUV light to pass from the light source 20 into the device;

FIG. 5A shows an embodiment of a coupling system having directional nozzles to introduce flow into a passageway established by an elongated body;

FIG. 5B shows an embodiment of a coupling system having tapered nozzles to introduce flow into a passageway established by an elongated body;

FIG. 5C shows a sectional view through the elongated body shown in FIG. 5A as seen along line 5C-5C in FIG. 5A showing nozzles which introduce flow into a passageway radially;

FIG. 5D shows a sectional view through the elongated body shown in FIG. 5A as seen along line in FIG. 5A showing nozzles which introduce flow into a passageway tangentially to establish a vortex;

FIG. 6 shows another embodiment of a coupling system having a vane disposed within a flow passageway;

FIG. 6A shows a sectional view through the elongated body shown in FIG. 6 as seen along line 6A-6A in FIG. 6;

DETAILED DESCRIPTION

Figure 1:
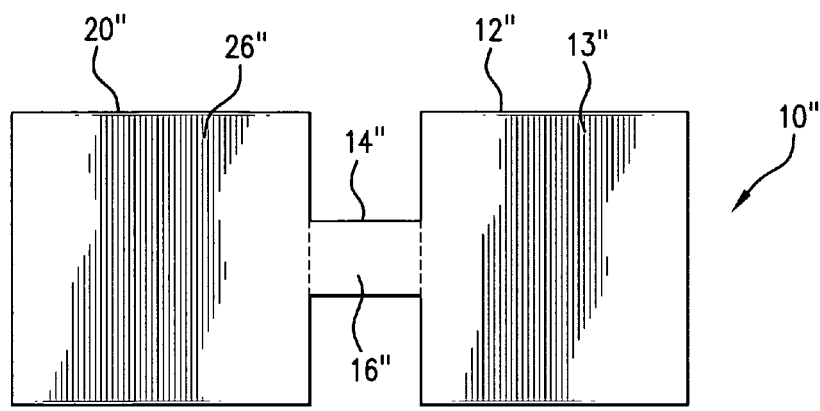
FIG. 1 shows a schematic simplified view, according to one aspect of an embodiment, of selected portions of an EUV photolithography apparatus having an EUV light source, a device utilizing EUV light and a system coupling the light source to the device.

With initial reference to FIG. 1 there is shown a schematic simplified view, according to one aspect of an embodiment, of selected portions of an EUV photolithography apparatus, generally designated 10", for e.g. exposing a substrate such as a wafer, flat panel workpiece, etc. with EUV light. For the apparatus 10" a device 12" utilizing EUV light, (e.g. an integrated circuit lithography tool such as a stepper, scanner, step and scan system, direct write system, device using a contact and/or proximity mask, etc.) may be provided having at least one chamber 13", the chamber(s) containing one or more optics (not shown) to, for example, illuminate a patterning means (not shown) such as a reticle, projection optic(s) (not shown) for projecting a patterned beam onto a substrate (not shown), and a mechanical assembly (not shown) for generating a controlled relative movement between the substrate and patterning means. As further shown, the apparatus 10" may include an EUV light source 20" having a chamber 26", e.g., a discharge produced plasma (DPP) EUV light source (see FIG. 1A), a laser produced plasma (LPP) EUV light source (see FIG. 1B), or any other type of EUV light source known in the pertinent art such as a hybrid (having laser and electrical discharge), synchrotron, etc. FIG. 1 also shows that the apparatus may include a coupling system 14" having at least one chamber 16" managing and/or limiting gas flow between the light source chamber 26" and the chamber 13" of the device 12" while allowing EUV light to pass from the light source 20" into the device 12". For example, as detailed further below, the coupling system 14", which may constitute a so-called "gaslock", may have subsystems to both introduce and remove gas from the chamber 16".

Figure 1A:
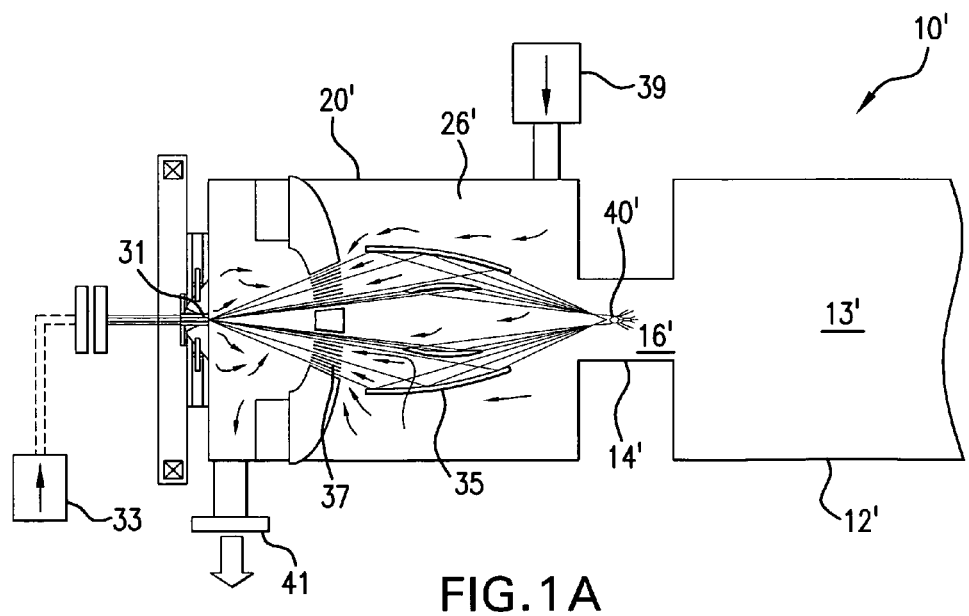
FIG. 1A shows a simplified, schematic view of a discharge produced plasma EUV light source shown operable connected to a device utilizing EUV light, e.g. lithography tool, and having a coupling system disposed therebetween.

FIG. 1A illustrates an apparatus 10' having an DPP light source 20', a device 12' utilizing EUV light, (e.g. stepper, scanner, etc.) and a coupling system 14' managing and/or limiting gas flow between the light source chamber 26' and the chamber 13' of the device 12' while allowing EUV light to pass from the light source 20' into the device 12'. As shown, the source 20' may be a so-called dense plasma focus device producing plasma at plasma site in a chamber 26', although it is to be appreciated that other discharge produced plasma (DPP) devices such as a conventional z pinch device, a hollow cathode z-pinch or a capillary discharge may be used. For the apparatus 10' shown, the source 20' may include a pair of electrodes 31 which may be, for example, arranged co-axially. In one setup, the central electrode may be hollow and an active gas 33, such as Xenon, tin vapor, lithium vapor, etc., may be passed through the hollow electrode to the plasma site. The central electrode may then be pulsed by an electrical pulse power system to a relatively high electrical potential relative to the outer electrode. Capacitance values, anode length and shape, and active gas delivery systems may be optimized to increase EUV light output. Also, one or both of the electrodes may be cooled, for example, by circulating water through the electrode wall(s) and/or using a heat pipe cooling system.

FIG. 1A further shows that a mirror 35 may be used to collect EUV radiation produced in the plasma and direct the radiation in a desired direction such as toward an intermediate focus 40' located within the chamber 16' of the coupling system 14'. Although a single grazing incidence mirror is shown, it is to be appreciated that a plurality of grazing incidence mirrors, arranged in a nested configuration, may be used. The reflecting surface of each mirror may be made of molybdenum, palladium, ruthenium, rhodium, gold or tungsten, for example.

FIG. 1A also shows that a conical nested debris collector 37 may be disposed in the chamber 26' between the electrodes 31 and mirror 35 having surfaces aligned with light rays extending out from the pinch site and directed toward the mirror 35. In addition, a buffer gas 39 such as hydrogen, helium, argon or combinations thereof, may be introduced into the chamber 26', as shown, and directed through the debris collector 37 for subsequent removal from the chamber 26' via pump 41. More details regarding a DPP light source may be found in U.S. Pat. No. 6,972,421 issued on Dec. 6, 2005, and entitled, EXTREME ULTRAVIOLET LIGHT SOURCE, the entire contents of which are hereby incorporated by reference herein.

Figure 1B:
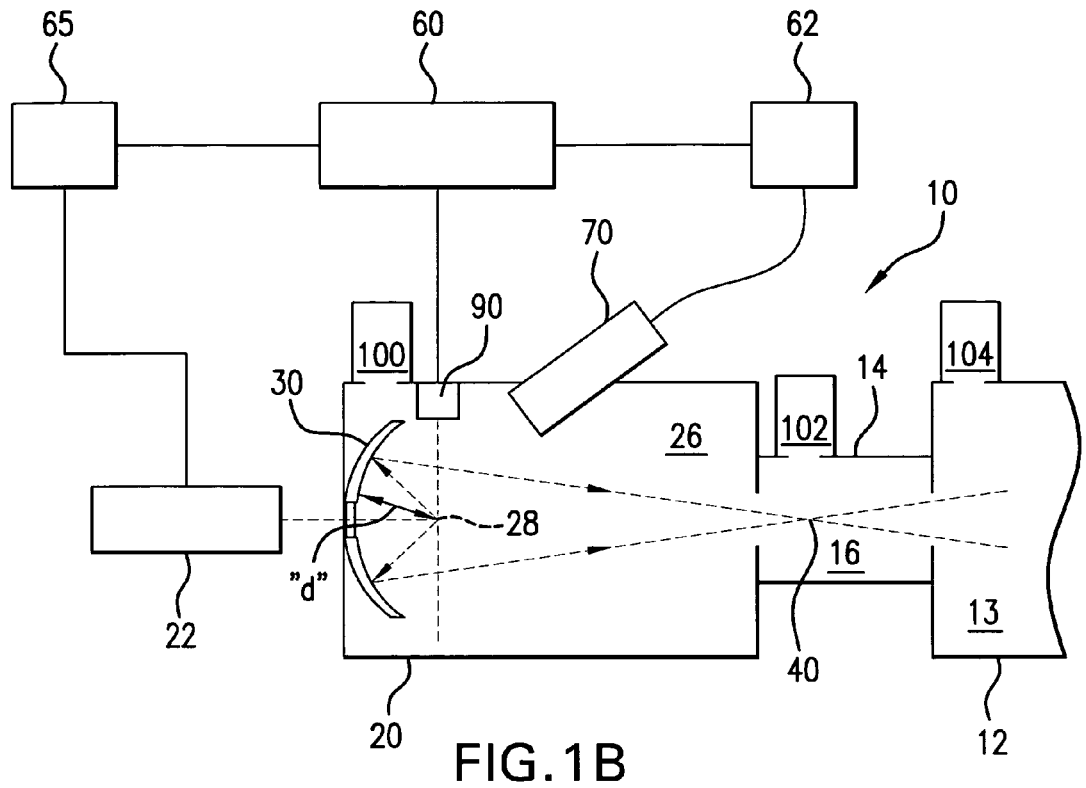
FIG. 1B shows a simplified, schematic view of a laser produced plasma EUV light source shown operable connected to a device utilizing EUV light, e.g. lithography tool and having a coupling system disposed therebetween.

FIG. 1B illustrates an apparatus 10" having an LPP light source 20", which, as shown, may include a system 22 for generating a train of light pulses and delivering the light pulses into a light source chamber 26. For the source 20", the light pulses may travel along one or more beam paths from the system 22 and into the chamber 26 to illuminate one or more targets at an irradiation region 28.

Suitable lasers for use in the device 22 shown in FIG. 1 may include a pulsed laser device, e.g., a pulsed gas discharge $CO_2$ laser device producing radiation at 9.3 μm or 10.6 μm, e.g., with DC or RF excitation, operating at relatively high power, e.g., 10 kW or higher and high pulse repetition rate, e.g., 50 kHz or more. In one particular implementation, the laser may have a MOPA configuration with multiple stages of axial-flow RF-pumped $CO_2$ amplification and having a seed pulse that is initiated by a Q-switched Master Oscillator (MO) with low energy and high repetition rate, e.g., capable of 50 kHz operation. From the MO, the laser pulse may then be amplified, shaped, and/or focused before entering the LPP chamber. Continuously pumped $CO_2$ amplifiers may be used for the system 22. For example, a suitable $CO_2$ laser device having an oscillator and three amplifiers (O-PA1-PA2-PA3 configuration) is disclosed in co-pending U.S. patent application Ser. No. 11/174,299 filed on Jun. 29, 2005, and entitled, LPP EUV LIGHT SOURCE DRIVE LASER SYSTEM, the entire contents of which are hereby incorporated by reference herein.

Depending on the specific application, other types of lasers may also be suitable, e.g., an excimer or molecular fluorine laser operating at high power and high pulse repetition rate. Examples include, a solid state laser, e.g., having a fiber, rod or disk shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

As further shown in FIG. 1B, the EUV light source 20 may also include a target material delivery system 90, e.g., delivering droplets of a target material into the interior of a chamber 26 to the irradiation region 28 where the droplets will interact with one or more light pulses, e.g., zero, one, or more than one pre-pulse(s) and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets or any other form which delivers the EUV emitting element to the irradiation region 28 in discrete, semi-continuous and/or continuous amounts. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$) at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV source is provided in co-pending U.S. patent application Ser. No. 11/406,216 filed on Apr. 17, 2006 entitled ALTERNATIVE FUELS FOR EUV LIGHT SOURCE, the contents of which are hereby incorporated by reference herein.

Continuing with FIG. 1B, the EUV light source 20 may also include an optic 30, e.g., a collector mirror in the form of a truncated ellipsoid having, e.g., a graded multi-layer coating with alternating layers of molybdenum and silicon on a substrate, e.g. SiC, polycrystalline Si, single crystal Si, etc. FIG. 1B shows that the optic 30 may be formed with a through-hole to allow the light pulses generated by the system 22 to pass through the optic 30 to reach the irradiation region 28. As shown, the optic 30 may be, e.g., an ellipsoidal mirror that has a first focus within or near the irradiation region 28 and a second focus at a so-called intermediate region 40 where the EUV light may be output from the EUV light source 20 pass through a coupling system 14 and be input to a device 12 utilizing EUV light, e.g., an integrated circuit lithography tool such as a stepper, scanner, step and scan system, direct write system, device using a contact and/or proximity mask, etc.

Also shown, the optic 30 may be positioned such that the closest operable point on the optic 30 is located at a distance, d from the irradiation region 28. It is to be appreciated that other optics may be used in place of the ellipsoidal mirror for collecting and directing light to an intermediate location for subsequent delivery to a device utilizing EUV light, for example the optic may be parabolic or may be configured to deliver a beam having a ring-shaped cross-section to an intermediate location, see e.g. co-pending U.S. patent application Ser. No. 11/505,177 filed on Aug. 16, 2006, entitled EUV OPTICS, the contents of which are hereby incorporated by reference.

For the source 20, a temperature control system may be used to maintain the optic 30 within a pre-selected operational temperature range. The temperature control system may include heating, e.g. one or more ohmic heaters placed on the collector mirror substrate backside, and/or cooling, e.g. one or more cooling channels formed in the collector mirror substrate to pass a heat exchange fluid, e.g. water or liquid gallium.

As used herein, the term "optic" and its derivatives includes, but is not necessarily limited to, components which reflect and/or transmit and/or operate on incident light and includes, but is not limited to, lenses, windows, filters, e.g. spectral filters, wedges, prisms, grisms, gradings, etalons, diffusers, transmission fibers, detectors and other instrument components, apertures, axicons, stops and mirrors including multi-layer mirrors, near-normal incidence mirrors, grazing incidence mirrors, specular reflectors and diffuse reflectors. Moreover, unless otherwise specified, the term "optic" as used herein and its derivatives is not meant to be limited to components which operate solely or to advantage within one or more specific wavelength range(s) such as at or near the EUV output light wavelength, the irradiation laser wavelength, a wavelength suitable for metrology or any other particular wavelength or wavelength band.

Continuing with reference to FIG. 1B, the EUV light source 20 may also include an EUV controller 60, which may also include a drive laser control system 65 for triggering one or more lamps and/or laser devices in the system 22 to thereby generate light pulses for delivery into the chamber 26, and/or for controlling beam delivery, e.g. optics moveable via actuator to adjust beam focusing, beam steering, beam shape, etc. A suitable beam delivery system for pulse shaping, focusing, steering and/or adjusting the focal power of the pulses is disclosed in co-pending U.S. patent application Ser. No. 11/358,992 filed on Feb. 21, 2006, entitled LASER PRODUCED PLASMA EUV LIGHT SOURCE, the contents of which are hereby incorporated by reference herein. As disclosed therein, one or more beam delivery system optics may be in fluid communication with the chamber 26. Pulse shaping may include adjusting pulse duration, using, for example a pulse stretcher and/or pulse trimming.

The EUV light source 20 may also include a droplet position detection system which may include one or more droplet imagers 70 that provide an output indicative of the position of one or more droplets, e.g., relative to the irradiation region 28. The imager(s) 70 may provide this output to a droplet position detection feedback system 62, which can, e.g., compute a droplet position and trajectory, from which a droplet error can be computed, e.g., on a droplet by droplet basis or on average. The droplet error may then be provided as an input to the controller 60, which can, for example, provide a position, direction and/or timing correction signal to the system 22 to control a source timing circuit and/or to control a beam position and shaping system, e.g., to change the location and/or focal power of the light pulses being delivered to the irradiation region 28 in the chamber 26. Also for the EUV light source 20, the target material delivery system 90 may have a control system operable in response to a signal (which in some implementations may include the droplet error described above, or some quantity derived therefrom) from the controller 60, to e.g., modify the release point, release timing and/or droplet modulation to correct for errors in the droplets arriving at the desired irradiation region 28.

For the EUV light source 20, the droplet delivery mechanism may include, for example, a droplet dispenser creating either 1) one or more streams of droplets exiting the dispenser or 2) one or more continuous streams which exit the dispenser and subsequently break into droplets due to surface tension. In either case, droplets may be generated and delivered to the irradiation region 28 such that one or more droplets may simultaneously reside in the irradiation region 28 allowing one or more droplets to be simultaneously irradiated by an initial pulse, e.g., pre-pulse to form an expanded target suitable for exposure to one or more subsequent laser pulse(s), e.g., main pulse(s), to generate an EUV emission. In one embodiment, a multi-orifice dispenser may be used to create a "showerhead-type" effect. In general, for the EUV light source 20, the droplet dispenser may be modulating or non-modulating and may include one or several orifice(s) through which target material is passed to create one or more droplet streams. More details regarding the dispensers described above and their relative advantages may be found in co-pending U.S. patent application Ser. No. 11/358,988 filed on Feb. 21, 2006, entitled LASER PRODUCED PLASMA EUV LIGHT SOURCE WITH PRE-PULSE, co-pending U.S. patent application Ser. No. 11/067,124 filed on Feb. 25, 2005, entitled METHOD AND APPARATUS FOR EUV PLASMA SOURCE TARGET DELIVERY, and co-pending U.S. patent application Ser. No. 11/174,443 filed on Jun. 29, 2005, entitled LPP EUV PLASMA SOURCE MATERIAL TARGET DELIVERY SYSTEM, co-pending U.S. patent application Ser. No. 11/827,803 filed on Jul. 13, 2007, entitled LASER PRODUCED PLASMA EUV LIGHT SOURCE HAVING A DROPLET STREAM PRODUCED USING A MODULATED DISTURBANCE WAVE, the contents of each of which are hereby incorporated by reference herein.

The EUV light source 20 may include one or more EUV metrology instruments (not shown) for measuring various properties of the EUV light generated by the source 20. These properties may include, for example, intensity (e.g., total intensity or intensity within a particular spectral band), spectral bandwidth, polarization, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

As indicated above, irradiation of a target at the irradiation region 28 produces a plasma and generates an EUV emission. In addition, as a by-product of this process, ions may be generated which exit the plasma, typically, in all directions.

Generally, the ion's initial energy exiting the plasma will vary over a range, with the range being affected by a number of factors including, but not limited to, the wavelength, energy, intensity and pulse-shape of the irradiating light, and the composition, size, shape and form of the target material. Also indicated above, these ions may, if unabated, degrade nearby optics, such as mirrors, laser input windows, metrology windows, filters, etc.

For the sources 20, 20' shown in FIGS. 1A and 1B, a gas, e.g. flowing or static, may be disposed between the plasma site and optic 30 (mirror 35), the gas establishing a gas number density, n, (i.e. number of molecules/volume) sufficient to operate over the distance, d, where d is the nearest distance between the plasma site and optic 30/mirror 35 to reduce ion energy to a target maximum energy level before the ions reach the optic 30/mirror 35. For example, a gas number density sufficient to reduce ion energy to a target maximum energy level between about 10-200 eV, and in some cases below 30 eV may be provided. For operation of the device shown in FIGS. 1A and 1B, it is contemplated that the gas establishing a target gas number density over the distance, d, will be present, and flowing, during EUV light generation. Factors which may be considered in selecting a suitable gas composition and gas number density include the ion stopping power of the gas composition (e.g. slowing ions below about 30 eV over a distance of about 10-30 cm) and the EUV absorption of the gas as a function of number density (e.g. for an LPP source, providing an acceptable in-band EEV absorption over a distance of about 1-2 m as the EUV light travels from the plasma to the collector mirror and then on to the intermediate region 40.

Suitable gases may, depending on the specific application, include hydrogen e.g., greater than 50 percent hydrogen (protium and/or deuterium isotopes), helium and combinations thereof. For example, for a plasma generating ions having a maximum initial ion energy (e.g. about 5-10 keV) and distance, d, of about 15 cm from the plasma, a suitable gas for reducing ion energy below about 30 eV may be hydrogen gas at a pressure of about 500 mtorr at room temperature. For some arrangements, pressures in the range of about 500 mtorr to 200 mtorr may be employed. SRIM (Stopping and Range of Ions in Matter) software (available at www-srim-org website) can be used to determine the gas number density (operable over a given distance, d) that is required to reduce the energy of an ion (having an initial ion energy) to below a selected energy. From the number density, the expected EUV absorption by the gas can be calculated. It is to be further appreciated that gas introduced into the chamber may react with light, ions and/or the plasma to dissociate and/or create ions, e.g. atomic hydrogen and/or hydrogen ions which may be effective for cleaning/etching and/or ion slowing.

FIG. 1B further shows that the light source 20 may include a gas management system 100 which may include a regulated gas source for introducing one or more gas(es) into the chamber 26, an adjustable pump for removing gas from the chamber 26, and, in some cases, a closed loop flow path recycling and/or re-introducing gas removed from the chamber 26. Although the EUV light source gas management system is described in detail herein with reference to the LPP source shown in FIGS. 1B and 2, it is to be appreciated that most of the following disclosure is equally applicable to the DPP source 20' shown in FIG. 1A.

Continuing with FIG. 1B, it will be seen that a gas management system 102 may be provided to introduce gas(es), remove gas(es), and/or regulate the flow of gas(es) within the chamber 16 of the coupling system 14, and a gas management system 104 may be provided to introduce gas(es), remove gas(es), and/or regulate the flow of gas(es) within the chamber 13 of the device 12 utilizing EUV light.

For example, the gas management systems 100, 102, 104 may include a pump forcing gas through a closed loop flow path, a heat exchanger removing heat from gas flowing in the flow path, and/or a filter removing at least a portion of a target species from gas flowing in the flow path, e.g. contaminants which may degrade optical components and/or absorb EUV light. A valve, regulator(s), or similar device may be provided to meter the amount of gas which is directed to the pumps. Also, in some cases, a conditioner may be provided to dilute and/or scrub gas(es) prior to release to the surroundings.

Removal of gas from a chamber 13, 15, 26 via one or more pump(s) may be performed to maintain a constant gas pressure in the respective chamber 13, 15, 26 in response to gas additions from the gas management system 100, 102, 104, and/or to remove contaminants, vapor, metal dust, etc. from a chamber 13, 15, 26, and/or to establish a pressure gradient in a chamber 13, 15, 26, e.g. to maintain a relatively high pressure between the optic 30 and irradiation region 28 and a smaller, relatively low pressure between the irradiation region 28 and the intermediate region 40. In addition, the pump(s), heat exchanger(s) and filter(s) may cooperate to remove heat and thereby control the temperature within a chamber 13, 15, 26, e.g. to control the temperature of the optic 30 and/or to remove contaminants, vapor, metal dust, etc. from a chamber 13, 15, 26 and/or to provide a pressure gradient in a chamber 13, 15, 26, e.g. to maintain a relatively high pressure between the optic 28 and irradiation region 28 and a smaller, relatively low pressure between the irradiation region 28 and the intermediate region 40.

Control of the gas source(s) and pump(s) may be used, concertedly, to maintain a selected gas pressure/pressure gradient and/or to maintain a selected flow rate within or through a chamber 13, 15, 26 and/or to maintain a selected gas composition, e.g. a selected ratio of several gases, e.g. $H_2$, HBr, He, etc. Typically, the selected flow rate(s) may depend, among other things, on the light source power input to the chamber, the amount of gas mixing, the efficient of the heat exchanger(s), the efficiency of other component cooling systems, e.g. the collector mirror cooling system, and/or the gas requirements/limitations in the other chambers.

By way of example, for a Sn target and $CO_2$ laser system with the optic 30 positioned about 15 cm from the irradiation site 28, a laser pulse energy of about 500 mJ and an EUV output repetition rate in the range of 10-100 kHz, a flow rate of about 200-400 slm (standard liters per minute) or greater, may be employed within the chamber 26.

For the light source 20, the gas management system 100 may introduce several gases, for example $H_2$, He, Ar and HBr, either separately and independently, or the gas may be introduced as a mixture. Moreover, although FIG. 1B illustrates the gas being introduced at one location, it is to be appreciated that the gas may be introduced at multiple locations, may be removed at multiple locations and/or may be evacuated for circulation at multiple locations. The gas may be supplied via a tank or may be generated locally. For example, the gas source may include an on-demand hydrogen/deuterium generator. Several types are available including a device with extracts hydrogen/deuterium from water/heavy water using a proton exchange membrane. Such a device is marketed and sold by Domnick Hunter under the product name Hydrogen Generator, for example see the www-domnickhunter-com website for details.

Depending on the gas used, a conditioner may be provided such as an appropriate chemical scrubber, e.g. to scrub etchant gas vapors, and/or a source of a diluent gas to dilute the exiting gas prior to release into the surroundings. For example, when $H_2$ is used (which tends to be explosive at gas concentrations of 4-25%), a diluent gas such as $N_2$ or air may be used to reduce the $H_2$ concentration before release (generally below 4% and more preferably below 0.4%). Alternatively, or in addition to the use of a diluent gas, a catalytic converter, possibly having a Platinum catalyst may be used to convert hydrogen to water.

Suitable gases for reducing ion energy may include, but are not limited to, hydrogen (protium and deuterium isotopes), helium and combinations thereof. In addition, a cleaning/etching gas for removing contaminants that have deposited on surfaces of optics may be included such as a gas having a halogen. For example, the etchant gas may include HBr, HI, $Br_2$, $Cl_2$, HCl, or combinations thereof. By way of example, a suitable composition when Sn or a Sn compound is used as the target material may include 50-99% $H_2$ and 1-50% HBr.

It is believed that these ion mitigation techniques may be used to suppress ion flux (i.e., the energy-integrated signal) by at least 4 orders of magnitude with an acceptable level of EUV absorption. In some cases, the collector mirror reflective coating may have about 500 sacrificial layers and still provide full EUV reflectivity. Taking into account a measured erosion rate of 0.2 layers per Million pulses (in the absence of ion mitigation) and the suppression factor of $10^4$ (due to the above-described mitigation), a collector lifetime exceeding $10^{12}$ pulses is estimated corresponding to about 1 year of operation of the collector mirror in a high volume manufacturing environment.

The use of an ion stopping gas and/or etchant gas(es) as described above, may, depending on the specific application, be used alone or in combination with one or more other ion mitigation techniques such as the use of a foil shield (with or without a slowing or deflecting gas), and the use of an electric and/or magnetic field(s) to deflect or slow ions and/or the use of pulse shaping to reduce ion flux may, see e.g. co-pending U.S. patent application Ser. No. 11/786,145 filed on Apr. 10, 2007, entitled LASER PRODUCED PLASMA EUV LIGHT SOURCE, the contents of which are hereby incorporated by reference.

Figure 2:
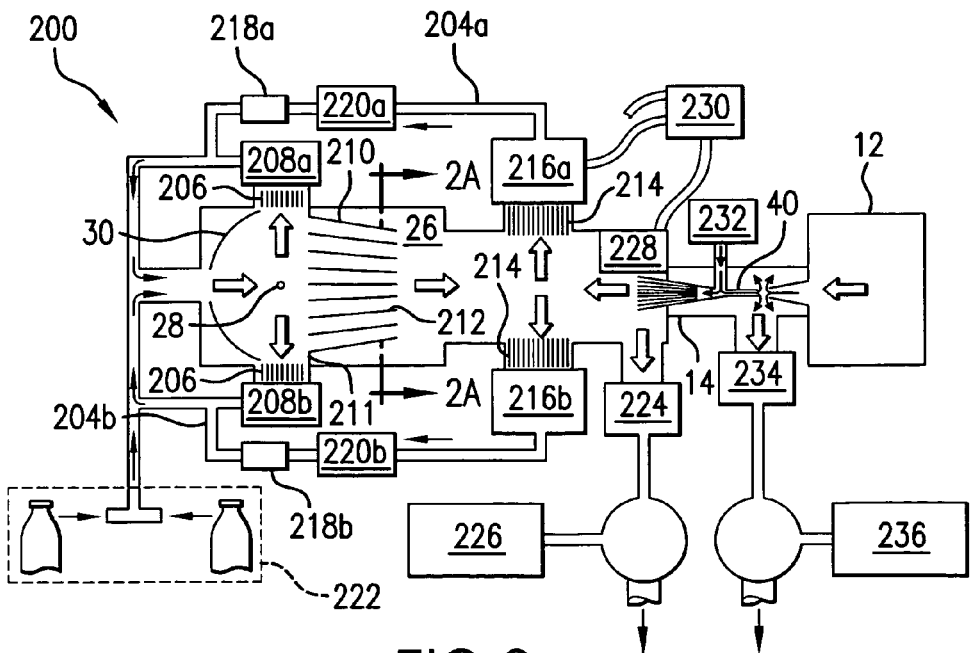
FIG. 2 shows a sectional view through a simplified, EUV light source illustrating an embodiment of an EUV light source gas management system.

FIG. 2 shows the gas management components of an EUV photolithography apparatus 200 having an EUV light source with a chamber 26 in which an optic 30 formed with a through-hole is disposed, e.g. a near-normal incidence, ellipsoidal collector mirror for directing EUV light from an irradiation region 28, e.g. where a target material droplet is irradiated by a drive laser (not shown in FIG. 2) producing EUV radiation, to an intermediate region 40 within the coupling system 14. As shown, the EUV light from the optic 30 passes through a coupling system 14 and is input to a device 12 utilizing EUV light, such as a lithography stepper, scanner, etc.

As shown in FIG. 2, the gas management system may include an enclosing structure defining one or more closed loop flow paths, the enclosing structure having a vessel, e.g. chamber 26, in fluid communication with one or more guideways 204a,b, each guideway 204a,b being external to the chamber 26.

Continuing with FIG. 2, it can be seen that within each closed loop flow path, gas is directed through the through-hole formed in the optic 30 and toward the irradiation region 28. From the through-hole, a portion of the gas flows through heat exchanger 206 and into pumps 208a,b. For the optic 30 shown in FIG. 2, the through-hole also functions to pass a laser beam from a laser source (not shown) to the irradiation region 28, although, other through-holes may be provided and used to flow gas through the optic 30. Moreover, other suitable flow paths may be established within the chamber 26, for example, see co-pending U.S. patent application Ser. No. 11/897,664 filed on Aug. 31, 2007, entitled GAS MANAGEMENT SYSTEM FOR A LASER PRODUCED PLASMA EUV LIGHT SOURCE, the contents of which are hereby incorporated by reference herein.

For the apparatus 200 shown, heat exchanger 206 may consist of a plurality of spaced apart, parallel, annularly shaped metal plates, with each plate extending around the circumference of the chamber 26. One, some or all of the plates may be formed with one or more internal passages to pass a heat exchange fluid, e.g. water, to cool each plate. The heat exchanger 206 may function to cool gas flowing through the exchanger 206 and/or to condense target material vapors that may undesirably absorb EUV radiation and/or foul optics, e.g. tin vapor when tin is used as a target material. Once cooled, the gas may pass through pumps 208a,b, which may be, for example, a turbo-pump or a roots-type booster, and thereafter be directed through an external guideway to a location where the gas will, once again flow through the through-hole formed in the optic 30. It is to be appreciated that one or more flow regulators (not shown) may be provided, e.g. one regulator near each pump, to balance flow throughout the gas management system.

FIGS. 2 and 2A also show that a portion of the gas from the through-hole formed in the optic 30 may flow within chamber 26 through multi-channel structure 210. As seen there, the multi-channel structure 210 may be disposed between the irradiation location 28 and the intermediate point 40 and may include a plurality of concentric, conical shaped vanes 212 that are arranged to allow light to travel from the optic 30 to the intermediate region 40 and may be designed to minimize EUV light obscuration. In addition, vane location may be selected to correspond to light paths which are unusable by the scanner 202, due, e.g. to obstructions in the scanner. One or more radial members 213 may be provided to support the concentric, conical shaped vanes. FIG. 2B shows another embodiment in which the vanes 212" consist of flat plates converging toward the intermediate region 40, as shown in FIG. 2. A flange 211 may be provided to restrict flow between the wall of the chamber 26 and the multi-channel structure 210, as shown.

FIGS. 3 and 4 show an alternative arrangement for a multi-channel structure 210' which includes a plurality of radially oriented vanes 212'. Alternatively, a multi-channel structure having both concentric conical and radial vanes may be employed. For the multi-channel structures, 210, 210', 210" shown in FIGS. 2A, 2B and 3, one, some or all of the vanes may be formed with internal passages to flow a heat exchange fluid, e.g. water or liquid gallium, to cool each vane. The multi-channel structures, 210, 210', 210" may function to cool gas flowing through the multi-channel structures, 210, 210', 210" and/or to condense target material vapors that may undesirably absorb EUV radiation, e.g. tin vapor when tin is used as a target material and/or to provide significant resistance to gas flow, thus, establishing a pressure gradient in the chamber 26 with a relatively high gas pressure upstream of the multi-channel structures, 210, 210', 210", e.g. between the irradiation region 28 and optic 30 to e.g. provide ion stopping and/or etching power, and a relatively low gas pressure downstream of the multi-channel structures, 210, 210', 210", e.g. between the multi-channel structures, 210, 210', 210" and the intermediate region 40, to e.g. minimize EUV absorption and/or to minimize flow directed toward the coupling system 14 and device utilizing EUV light 202.

For the device shown, the multi-channel structures, 210, 210', 210" may be positioned to receive source material from irradiation zone 28. As disclosed herein, depending on the specific application, the structure 210, 210', 210" may be used alone or in combination with one or more other debris mitigation techniques such as the use of an ion slowing gas as described above, the use of a foil shield (with or without an ion slowing or deflecting gas), the use of an electric and/or magnetic field(s) to deflect or slow ions, and the use of a pulse-shaped beam.

A beam stop may be provided which may be separate from, attached to or formed integral with the multi-channel structure 210, 210', 210". In the operation of the device, a target material, such as a droplet, is irradiated by one or more pulses to generate plasma. Typically, irradiated target material moves along the beam direction and spreads into a wide solid angle. A large portion of the material may be collected by the multi-channel structure 210, 210', 210", which also may be temperature controlled. For example, a temperature controlled beam stop for collecting and directing LPP target material is disclosed and claimed in co-pending U.S. patent application Ser. No. 11/509,925 filed on Aug. 25, 2006, entitled SOURCE MATERIAL COLLECTION UNIT FOR A LASER PRODUCED PLASMA EUV LIGHT SOURCE, the entire contents of which are hereby incorporated by reference herein. See also co-pending U.S. patent application Ser. No. 11/786,145 filed on Apr. 10, 2007, entitled LASER PRODUCED PLASMA EUV LIGHT SOURCE, the entire contents of which are hereby incorporated by reference herein.

By-products of the target material irradiation may include metal dust, target material vapor and micro-droplets or clusters and can be in several forms, for example, when tin, e.g., pure tin, or a tin compound, e.g., $SnBr_4$, $SnH_4$, $SnBr_2$ etc, is used as the source material, the by-products may include tin and tin compounds including oxides. Dusts and other contaminates, e.g., from collector mirror erosion, etc. may also be present in the chamber. These by-products may, among other things, damage optics and absorb/scatter EUV radiation.

By way of example, and not limitation, the multi-channel structure 210, 210', 210" may function to collect liquids and solids (in some cases remelting solids) and/or condense vapors. For a target material containing Sn, some or all of the operable surfaces of the multi-channel structure 210, 210', 210" may be maintained at a temperature above the melting point of Sn, e.g., above about 230 C. At this temperature, micro-droplets may stick to the surface of the multi-channel structure 210, 210', 210", and in some cases, flow downwardly by gravitational force. Solidified metal dust may be re-melted into the molten material and also flow downward. The compounds of Sn (e.g., oxides) may also be trapped by the liquid flow and removed from the chamber. The multi-channel structure 210, 210', 210" may have inter-connecting channels (not shown) for directing liquid metal flow from surfaces to the bottom where the liquid metal may be collected. The location and direction of the channels may be configured relative to the EUV source orientation (e.g. the light source axis may be tilted relative to horizontal at about 28 degrees) to ensure proper flow of liquid on the multi-channel structure 210, 210', 210". On the other hand, in some applications, some or all of the operable surfaces of the multi-channel structure 210, 210', 210" may be maintained at a temperature below the melting point of Sn, e.g., below about 230 C (for a target material containing Sn). At these temperatures, condensation is promoted and liquids and solids may be allowed to accumulate on the multi-channel structure 210, 210', 210". The multi-channel structure 210, 210', 210" may also function as a cold trap condensing vapors, e.g., Sn vapor present in the chamber.

FIG. 2 shows that from the multi-channel structures, 210, gas flows generally in the direction of the intermediate region 40. FIG. 2 also shows that some, a portion, or all of the gas exiting the multi-channel structures, 210 may pass through heat exchanger 214 and into pumps 216$a,b$. For the source shown, heat exchanger 214 may consist of a plurality of spaced apart, parallel, annularly shaped metal plates that extend around the circumference of the chamber 26. One, some or all of the plates may be formed with one or more internal passages to pass a heat exchange fluid, e.g. water, to cool each plate. The heat exchanger 214 may function to cool gas flowing through the exchanger 214 and/or to condense target material vapors that may undesirably absorb EUV radiation, e.g. tin vapor when tin is used as a target material. Once cooled, the gas may pass through pumps 216$a,b$, which may be, for example, a turbo-pump or a roots-type booster, and thereafter be directed through an external guideway 204$a,b$ to a location where the gas will, once again flow through the through-hole formed in the optic 30. It is to be appreciated that one or more flow regulators (not shown) may be provided, e.g. one regulator near each pump, to balance flow throughout the gas management system. One or both of the guideways 204$a,b$ may include an optional filter 218$a,b$, e.g. scrubber, and/or an additional, optional, heat exchanger 220$a,b$. For the light source shown, the filters 218$a,b$ may function to remove at least a portion of a target species, e.g. contaminants that may degrade optical components and/or absorb EUV light, from gas flowing in the flow path. For example, when a tin containing material is used as a source material to generate the plasma, contaminants such as tin hydrides, tin oxides and tin bromides may be present in the gas which may degrade optical components and/or absorb EUV light. These contaminants may be removed using one or more suitable filters, e.g. zeolite filters, cold traps, chemical absorbers, etc. The heat exchangers 220$a,b$ may, for example, consist of a plurality of parallel metal plates, spaced apart and internally cooled, as described above, and may function to cool the gas in the guideway 204$a,b$ and/or condense and thereby remove vapors, e.g. tin vapors from the gas stream.

FIG. 2 further shows that the gas management system may include a regulated gas source 222 for selectively introducing, either continuously or in discrete amounts, one or more gas(es) into the chamber 26, e.g. for ion stopping (e.g. $H_2$, (protium and/or deuterium isotopes) and/or He), and/or etching plasma generated debris deposits from surfaces in the chamber 26, such as the surface of optic 30, (e.g. HBr, HI, $Br_2$, $Cl_2$, HCl, $H_2$, or combinations thereof). It is to be appreciated that the gas source 222 may include one or more flow regulators (not shown).

FIG. 2 further shows that the gas management system may include an adjustable pump 224, e.g. turbopump or roots booster, and optional conditioner 226, (e.g. to dilute and/or scrub the gas prior to release, as described above, with reference to conditioner 114 shown in FIG. 1) for selectively removing some or all of the gas from the chamber 26, and/or other portions of the gas management system, e.g. guideways 204$a,b$ etc. either continuously or in discreet amounts. In some cases, a heat exchanger (not shown) may be placed upstream of the pump 224 to protect the pump from high temperature gas.

Addition of fresh gas to the chamber 26 via gas source 222 and/or removal of gas via pump 224 from the chamber 26 may be performed to remove heat and thereby control the temperature within the chamber 26, and/or to remove contaminants, vapor, metal dust, etc. from the chamber 26, and/or to provide a pressure gradient in the chamber 26, e.g. to maintain a relatively large pressure between the optic 30 and irradiation region 28 and a smaller, relatively low pressure between the irradiation region 28 and the intermediate region 40.

Control of the gas source 222 and pumps 216a,b and 224 may be used to maintain a selected gas number density in a selected area of the chamber and/or pressure gradient and/or to maintain a selected flow rate through the chamber 26 and or to maintain a selected gas composition, e.g. a selected ratio of several gases, e.g. $H_2$, HBr, He, etc.

FIG. 2 further shows that one of more gas monitors 228 measuring one or more gas characteristic including, but not limited to, gas temperature, pressure, composition, e.g. He/$H_2$ ratio, HBr gas concentration, etc. may be disposed in the chamber 26 or placed in fluid communication therewith to provide one or more signals indicative thereof to a gas management system controller 230, which, in turn, may control the pumps, regulators, etc. to maintain a selected gas temperature, pressure and/or composition. For example, a mass-spectrometer residual gas monitor with differential pumping may be used to measure HBR gas concentration.

FIG. 2 also shows that a coupling system 14 may be provided including provisions for maintaining pre-selected flows (flow rates and/or flow directions), temperatures, gas number densities and/or contaminant levels at or near the intermediate region 40. In particular, the coupling system 14 may be designed to meet specifications for one or more specifications that are developed by stepper/scanner manufacturers which typically limit the amount of contaminants, e.g. tin and tin compounds, cleaning/etchant gas(es), e.g. HBr, heat, etc. that enter the stepper/scanner at the EUV light input port. As shown in FIG. 2, gas management near the intermediate region 40 may include the maintenance of a pressure below the pressure at the scanner input such that gas flows from the device 12 and toward the intermediate region 40. FIG. 2 also shows that the gas management system may include a gas source 232 providing a stream of gas that flows from the intermediate region 40 toward the irradiation zone 28 and a pump 234 and optional conditioner 236, as described above, for selectively evacuating the intermediate region 40.

FIG. 5 shows an embodiment of a coupling system 1014 managing and/or limiting gas flow between the chamber 26 of the light source 20 and the chamber 13 of the device 12 while allowing EUV light to pass from the light source 20 into the device 12. As shown, the dotted lines 1016 indicate EUV light converging from the source 20 to an intermediate focus 1018 and diverging therefrom into the chamber 13 of the device 12 for use therein. As shown, the coupling system 1014 may include a wall 1012 surrounding an intermediary chamber 1020 that is in fluid communication with the chamber 13 of the device 12. The system 1014 may further include an elongated body 1022 restricting flow from the chamber 26 to the intermediary chamber 1020 and chamber 13 of the device 12. For the system 1014, the body 1022 may be formed to at least partially surrounding a passageway 1024 and having a first open end 1026 allowing EUV light to enter the passageway 1024 from the chamber 26 and a second open end 1028 allowing EUV light to exit the passageway into the intermediary chamber 1020 and chamber 13 of the device 12. As shown, the body 1022 may be shaped, e.g. having a necked region, to establish at least one location 1030 having a reduced cross-sectional area relative to the first end 1026 and second end 1028. As shown, the reduced cross-sectional area may be located at the same position along the optical axis as the intermediate focus 1018, however it is to be appreciated that the necked region of the body 1022 may be distanced from the intermediate focus 1018. It can be noted that the shape of the body 1022 may be shaped to substantially conform to the light cone enter and light cone leaving the intermediate focus 1018. Also shown, the diameter of the end 1026 may be larger that the diameter of the end 1028.

Continuing with FIG. 5, it can be seen that the body 1022 may be formed with one or more apertures 1032, e.g. through-hole(s) extending through the wall of the body 1022, to allow gas to be introduced into the passageway 1024 at a position between the first end 1026 of the body 1022 and the location 1030 having a reduced cross-sectional area, e.g. at a distance X along the optical axis from the location 1030 having a reduced cross-sectional area and/or the intermediate focus 1018. More specifically, as shown, gas from a regulated gas source 1034 may be caused to flow in the direction of arrow 1036 into manifold 1038 which as shown, may be disposed to surround the body 1022 at the location of the aperture(s) 1032. For example, the gas from the gas source 1034 may be argon, hydrogen, helium and combinations thereof, or any other gas which has a relatively low EUV absorption and which is allowed to be present in chamber 26 and/or chamber 13.

FIG. 5 also shows that a flange 1040 may be provided extending between the outer wall of the coupling system 1014 and the wall of the body 1022 to restrict flow between the chamber 26 of the light source 20 and the intermediary chamber 1020 to the passageway 1024. As shown, the coupling system 1014 may comprise a plurality of apertures 1032, and the apertures may be configured to direct flow entering the passageway 1024 in a direction toward the open end 1026 of the body 1022. In one setup, the system may comprise one or more nozzles (not shown) directing flow entering the passageway 1024 toward the first end 1026 of the elongated body 1022.

FIG. 5 further shows that the coupling system 1014 may include a wall 1012 surrounding an intermediary chamber 1020 that includes a volume disposed between the open end 1028 of the body 1022 and the light input aperture of the device 12. For the coupling system 1014 shown, one or more pump(s) 1042 which may be, for example, one or more turbo-pump(s) or roots-type booster(s), may be positioned to remove gas from the intermediary chamber 1020 and cause gas to flow in the direction of arrows 1044, 1046. Lastly, as shown, a conical shroud 1048 may extend from the device 12 and into the intermediary chamber 1020 and arranged to partially surround the EUV light input aperture 1042 to reduce and/or eliminate flows from the intermediary chamber 1020 into the device 12.

With the arrangement shown in FIG. 5 and described above, the pump(s) 1042 flow rate and regulated gas source 1034 flow rate may be adjusted such that gas from the chamber 13 of the device 12 into the intermediary chamber 1022 (arrow 1050) suppressing contaminant flow into the device 12 and gas flows from the aperture(s) 1032 through the open end 1026 of the elongated body 1022 and into the chamber 26 of the light source 20 (arrow 1052) establishing a counterflow for contaminant diffusion into the body 1022. In particular, these flows (arrows 1050 and 1052) may be achieved with gas in the chamber 26 of the light source 20 at a pressure $P_1$, gas in the chamber 13 of the device at a pressure $P_2$, with $P_1 > P_2$. In some cases, the pump(s) 1042 flow rate(s) and regulated gas source 1034 flow rate may be adjusted to direct flow from the passageway 1024 through the open end 1028 of the elongated body 1022 and into the intermediary chamber 1020 (arrow 1054). In some cases, the ion slowing buffer gas in chamber 26 may be about 200-600 mtorr (H2) and the pressure at the plane of the aperture(s) 1032 exceeding the chamber 26 pressure. At these pressure levels, the flow regime in the passageway 1024 may be viscous, allowing the gas flow rate (arrow 1054) from the intermediate focus 1018 to the intermediary chamber 1020 to be minimized by lengthening of the body 1022.

For the arrangement shown in FIG. 5, the requirement that gas flow in the direction of arrow 1050, for most practical arrangements, may imply that the maximum pressure in the plane of apertures 1032 may be limited by: 1) limits in the pumping speed of pump(s) 1042 and 2) the resistance of the section of the elongated body 1022 from the reduced cross sectional area to the end 1028. The resistance of the elongated body 1022, in turn, depends, for a flow regime that is viscous or molecular, on the cone angle(s), the dimension at the reduced cross sectional area and the length of the body 1022. As described above, introduction of gas from gas source 1034 at a distance from the reduced cross sectional area and/or introducing gas in a direction toward the end 1026 may allow for an increase the flow (arrow 1052) for a given elongated body 1022 and given pump 1042 speed, while maintaining flow in the direction of arrow 1050.

Maximizing flow from the body 1022 and into the chamber 26 may be desirable because the suppression factor for diffusion of contaminants (HBr, Sn vapor, Sn compounds) in a direction opposite a gas flow is defined by Pecklet number which, for a cylinder of uniform cross-section, is expressed by the formula: $Pe=V*L/D$, where V is average flow velocity in the suppression zone, L is the length of the suppression zone and D is diffusion coefficient of the contaminants in the gas. Thus, suppression is higher for high flow velocity.

FIG. 5A shows another embodiment of a coupling system 1014' managing and/or limiting gas flow between the chamber 26 of a light source 20 and the chamber 13 of a device 12 while allowing EUV light to pass from the light source 20 into the device 12, the coupling system 1014' having one or more elements in common with the coupling system 1014 shown in FIG. 5.

For the coupling system 1014' shown, a wall surrounds an intermediary chamber 1020 that is in fluid communication with the chamber 13 of the device 12. The system 1014' may further include an elongated body 1022 restricting flow from the chamber 26 to the intermediary chamber 1020 and chamber 13 of the device 12. For the system 1014', the body 1022 may be formed to at least partially surrounding a passageway 1024 and having a first open end 1026 allowing EUV light to enter the passageway 1024 from the chamber 26 and a second open end 1028 allowing EUV light to exit the passageway into the intermediary chamber 1020 and chamber 13 of the device 12. As shown, the body 1022 may be shaped, e.g. having a necked region, to establish at least one location 1030A having a reduced cross-sectional area relative to the ends.

Continuing with FIG. 5A, it can be seen that the body 1022 may include one or more nozzles 1031, each nozzle 1031 terminating in a respective aperture 1032, to allow gas to be introduced into the passageway 1024 at a position between the end of the body 1022 and the location 1030 having a reduced cross-sectional area. More specifically, as shown, gas, e.g. argon, hydrogen, helium, etc. from a regulated gas source 1034 may be caused to flow through aperture(s) 1032A and into passageway 1024A.

FIG. 5B shows that the nozzle 1031' may be shaped to include a taper (as shown) or other types of shaped nozzle such a de Laval nozzle (not shown), etc. may be used. As shown in FIG. 5C, the nozzles 1031A-D" may be oriented to introduce the flow into the passageway 1024 radially, or as shown in FIG. 5C, the nozzles 1031A-C'" may be oriented to introduce the flow into the passageway 1024 tangentially to establish a vortex in the passageway 1024. In some cases, the vortex may increase upstream contaminant suppression by changing the velocity profile across the passageway to reduce the amount of area in the passageway having relatively small velocities.

FIGS. 6 and 6A show another embodiment of a coupling system 1014A managing and/or limiting gas flow between the chamber 26 of a light source 20 and the chamber 13 of a device 12 while allowing EUV light to pass from the light source 20 into the device 12, the coupling system 1014A having one or more elements in common with the coupling system 1014 shown in FIG. 5.

For the coupling system 1014A shown, a wall surrounds an intermediary chamber 1020 that is in fluid communication with the chamber 13 of the device 12. The system 1014A may further include an elongated body 1022A restricting flow from the chamber 26 to the intermediary chamber 1020 and chamber 13 of the device 12. For the system 1014A, the body 1022A may be formed to at least partially surrounding a passageway 1024A and having a first open end allowing EUV light to enter the passageway 1024A from the chamber 26 and a second open end allowing EUV light to exit the passageway into the intermediary chamber 1020 and chamber 13 of the device 12. As shown, the body 1022A may be shaped, e.g. having a necked region, to establish at least one location 1030A having a reduced cross-sectional area relative to the ends.

Continuing with FIG. 6, it can be seen that the body 1022A may be formed with one or more apertures 1032A, e.g. through-hole(s) extending through the wall of the body 1022A, to allow gas to be introduced into the passageway 1024A at a position between the end of the body 1022A and the location 1030A having a reduced cross-sectional area. More specifically, as shown, gas, e.g. argon, hydrogen, helium, etc. from a regulated gas source 1034 may be caused to flow through aperture(s) 1032A and into passageway 1024A.

FIG. 6 further shows that the coupling system 1014A may include a wall surrounding an intermediary chamber 1020 that includes a volume disposed between the open end of the body 1022A and the light input aperture of the device 12. For the coupling system 1014A shown, one or more pump(s) 1042 may be positioned to remove gas from the intermediary chamber 1020 and cause gas to flow in the direction of arrow 1044.

Cross referencing FIGS. 6 and 6A, it can be seen that one or more vane(s) 1060 may be disposed in the passageway 1024A of the elongated body 1022A. As shown, the vane 1060 may extend across the elongated body 1022A and may extend from the end 1028A to a location between the end 1028A and the intermediate focus 1018. With this arrangement, the vane 1060 may function to reduce flow with passageway 1024A from the reduced cross sectional area 1030A toward the end 1028A of the elongated body 1022A and into the intermediary chamber 1020 (arrow 1054A). As indicated above, increasing the resistance of the elongated body 1022A may allow for an increases pressure in the plane of apertures 1032 thereby suppressing contaminant flow into the chamber 13, while maintaining flow in the direction of arrow 1050, and for a given pump 1042 speed.

In more analytical terms, the resistance of a channel to gas flow in a viscous regime depends generally on transverse dimension, D, of the channel as $1/D^4$. In the case of cylindrical pipe, the transverse dimension is the diameter of the pipe. Thus, a large contribution to the resistance of the body 1022A shown is the necked region while the cone portion between the necked region and end 1028A generally makes a smaller contribution. Nevertheless, this can be improved by dividing the cone into two parts by placing vane at some distance X1 from the necked portion, as shown. This reduces the transverse dimension, and as a consequence, increases resistance. If possible, the vane may be positioned within a shadow caused by an existing EUV light obscuration, e.g. an obscuration generated by beam dump, droplet generator, debris barrier, etc. By way of example, for an obscuration having a thickness of 40 mm and located at about 1000 mm from the intermediate focus, a shadow having a thickness of about 0.2 mm will be established at X1=5 mm on the other side of the intermediate focus.

Figure 7:
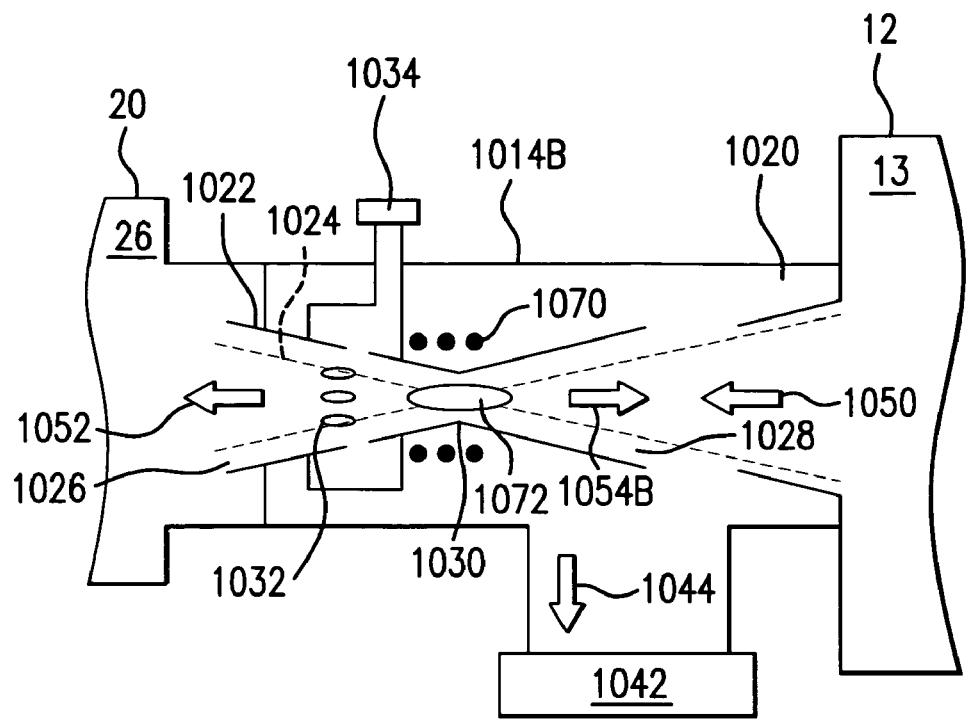
FIG. 7 shows another embodiment of a coupling system having a system for generating an inductively coupled plasma (ICP) within a flow passageway.

FIG. 7 shows another embodiment of a coupling system 1014B managing and/or limiting gas flow between the chamber 26 of a light source 20 and the chamber 13 of a device 12 while allowing EUV light to pass from the light source 20 into the device 12, the coupling system 1014B having one or more elements in common with the coupling system 1014 shown in FIG. 5.

For the coupling system 1014B shown, a wall surrounds an intermediary chamber 1020 that is in fluid communication with the chamber 13 of the device 12. The system 1014B may further include an elongated body 1022 restricting flow from the chamber 26 to the intermediary chamber 1020 and chamber 13 of the device 12. For the system 1014B, the body 1022 may be formed to at least partially surround a passageway 1024 and have a first open end 1026 allowing EUV light to enter the passageway 1024 from the chamber 26 and a second open end 1028 allowing EUV light to exit the passageway into the intermediary chamber 1020 and chamber 13 of the device 12. As shown, the body 1022 may be shaped, e.g. having a necked region, to establish at least one location 1030 having a reduced cross-sectional area relative to the ends.

Continuing with FIG. 7, it can be seen that the body 1022 may be formed with one or more aperture(s) 1032, e.g. through-hole(s) and/or directional nozzle(s) extending through the wall of the body 1022, to allow gas to be introduced into the passageway 1024 at a position between the end of the body 1022 and the location 1030 having a reduced cross-sectional area. More specifically, as shown, gas, e.g. argon, hydrogen, helium, etc. from a regulated gas source 1034 may be caused to flow through aperture(s) 1032 and into passageway 1024.

FIG. 7 further shows that the coupling system 1014B may include a wall surrounding an intermediary chamber 1020 that includes a volume disposed between the open end of the body 1022 and the light input aperture of the device 12. For the coupling system 1014B shown, one or more pump(s) 1042 may be positioned to remove gas from the intermediary chamber 1020 and cause gas to flow in the direction of arrow 1044.

Continuing with FIG. 7, the coupling system 1014B may include a source 1070 generating an electromagnetic field in the passageway 1024 at or near the location 1030 having a reduced cross-sectional area to produce a plasma 1072 therein. As shown, the source 1070 may comprise one or more radio-frequency (RF) coil(s) for creating an inductively coupled (ICP) discharge plasma 1072 in the passageway 1024. Functionally, a hot region (e.g. plasma 1072) in the gas flow may create a significant drag to gas flow. In general, gas may tend to flow around the plasma region 1072 and along the walls of the body 1022. For the arrangement shown, the walls of the body 1022 may be either non-conductive (e.g. made of ceramic, fused silica, etc.) or may be made of a conductive material (e.g. metal) with a slit (not shown) cut through the wall, e.g. from end 1026 to end 1028 and the slit sealed, e.g. with a non-conductive isolator insert (not shown).

With the arrangement shown in FIG. 7 and described above, the pump(s) 1042 flow rate and regulated gas source 1034 flow rate may be adjusted such that gas from the chamber 13 of the device 12 flows into the intermediate chamber 1022 (arrow 1050) suppressing contaminant flow into the device 12 and gas flows from the aperture(s) 1032 through the open end 1026 of the elongated body 1022 and into the chamber 26 of the light source 20 (arrow 1052) establishing a counterflow for contaminant diffusion into the body 1022. In particular, these flows (arrows 1050 and 1052) may be achieved with gas in the chamber 26 of the light source 20 at a pressure $P_1$, gas in the chamber 13 of the device at a pressure $P_2$, with $P_1 > P_2$. In some cases, the pump(s) 1042 flow rate(s) and regulated gas source 1034 flow rate may be adjusted to direct flow from the passageway 1024 through the open end 1028 of the elongated body 1022 and into the intermediary chamber 1020 (arrow 1054). In some cases, the ion slowing buffer gas in chamber 26 may be about 200-600 mtorr (H2) and the pressure at the plane of the aperture(s) 1032 may exceed the chamber 26 pressure. At these pressure levels, the flow regime in the passageway 1024 may be viscous, allowing the gas flow rate (arrow 1054) from the intermediate focus 1018 to the intermediary chamber 1020 to be minimized by lengthening of the body 1022. In addition, the pump(s) 1042 flow rate and regulated gas source 1034 flow rate may be adjusted relative to the pressures $P_1$ and $P_2$ to establish a pressure in the location 1030 at the reduced cross sectional area of about 0.3 to 2 torr, which is suitable for an ICP discharge. The ionization may also be facilitated by EEV radiation which has maximum intensity at the intermediate focus.

With this arrangement, the plasma 1072 may function to reduce flow within passageway 1024 from the reduced cross sectional area 1030 toward the end 1028 of the elongated body 1022 and into the intermediary chamber 1020 (arrow 1054). As indicated above, increasing the resistance within the elongated body 1022 may allow for an increase in pressure in the plane of apertures 1032 thereby suppressing contaminant flow into the chamber 13, while maintaining flow in the direction of arrow 1050, and for a given pump 1042 speed.

For the arrangement shown in FIG. 7, the plasma 1072 may have about the same absorption of EUV light as non-ionized gas in this region. For example, the gas may be ionized to Z=1, in which case the ion absorption may be about the same as for neutrals. In particular, the ionization degree at this pressure range may not be very high (e.g. from 1E-3 to 1E-6), and the electron concentration (1E-13 to 1E-10 $cm^{-3}$) may be relatively low to cause any appreciable absorption of EUV radiation.

Figure 8:
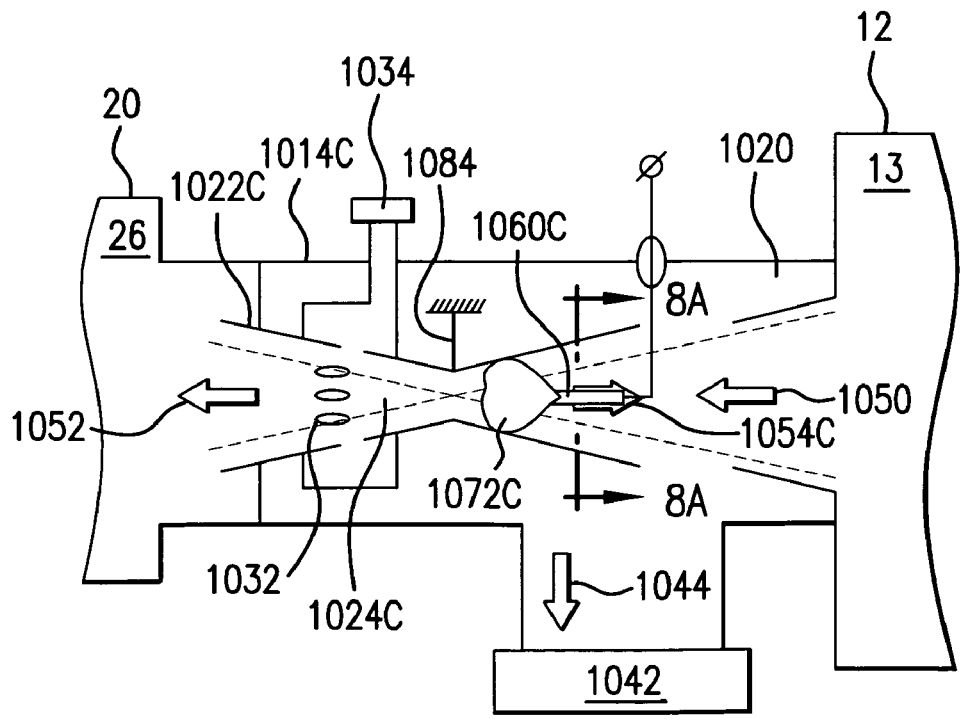
FIG. 8 shows another embodiment of a coupling system having a system for generating an discharge plasma within a flow passageway.

FIG. 8 shows another embodiment of a coupling system 1014C managing and/or limiting gas flow between the chamber 26 of a light source 20 and the chamber 13 of a device 12 while allowing EUV light to pass from the light source 20 into the device 12, the coupling system 1014C having one or more elements in common with the coupling systems shown in FIGS. 5-7.

For the coupling system 1014C shown, a wall surrounds an intermediary chamber 1020 that is in fluid communication with the chamber 13 of the device 12. The system 1014C may further include a conductive elongated body 1022C, e.g. made of metal or other conductive material, restricting flow from the chamber 26 to the intermediary chamber 1020 and chamber 13 of the device 12. For the system 1014C, the body 1022C may be formed to at least partially surround a passageway 1024 and have a first open end 1026 allowing EUV light to enter the passageway 1024 from the chamber 26 and a second open end 1028 allowing EUV light to exit the passageway into the intermediary chamber 1020 and chamber 13 of the device 12. As shown, the body 1022 may be shaped, e.g. having a necked region, to establish at least one location 1030 having a reduced cross-sectional area relative to the ends.

Continuing with FIG. 8, it can be seen that the body 1022 may be formed with one or more aperture(s) 1032, e.g. through-hole(s) and/or directional nozzle(s) extending through the wall of the body 1022, to allow gas to be introduced into the passageway 1024 at a position between the end of the body 1022 and the location 1030 having a reduced cross-sectional area. More specifically, as shown, gas, e.g. argon, hydrogen, helium, etc. from a regulated gas source 1034 may be caused to flow through aperture(s) 1032 and into passageway 1024.

FIG. 8 further shows that the coupling system 1014C may include a wall surrounding an intermediary chamber 1020 that includes a volume disposed between the open end of the body 1022 and the light input aperture of the device 12. For the coupling system 1014C shown, one or more pump(s) 1042 may be positioned to remove gas from the intermediary chamber 1020 and cause gas to flow in the direction of arrow 1044.

Figure 8A:
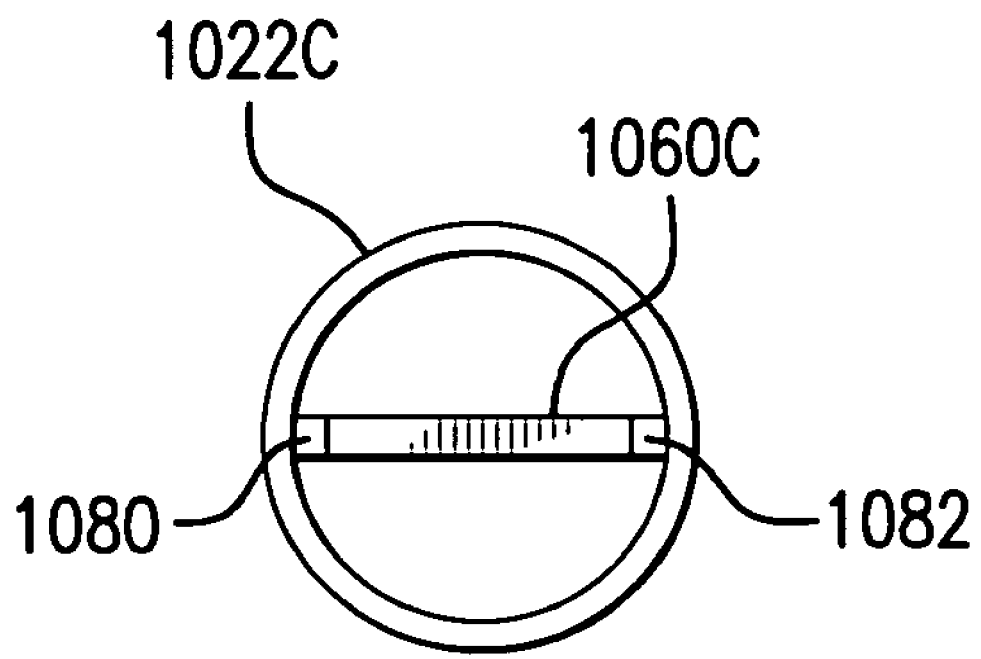
FIG. 8A shows a sectional view through the elongated body shown in FIG. 8 as seen along line 8A-8A in FIG. 8.

Continuing with FIG. 8, the coupling system 1014C may include a source generating an electromagnetic field in the passageway 1024 between the location 1030 having a reduced cross-sectional area and the end 1028 of the body 1022C to produce plasma 1072C therein. As best appreciated cross referencing FIGS. 8 and 8A, it can be seen that one or more conductive vane(s) 1060C, e.g. made of metal or other conductive material, may be disposed in the passageway 1024C of the elongated body 1022C. As shown, the vane 1060C may extend from the end 1028 to a location between the end 1028A and the intermediate focus 1018. FIG. 8A shows that isolators 1080, 1082 made of an insulating and/or dielectric material may be provided to separate the conductive vane 1060C from the conductive body 1022C. With this arrangement, the vane 1060C may function to reduce flow (as described above) within passageway 1024C from the reduced cross sectional area 1030C toward the end 1028C of the elongated body 1022C and into the intermediary chamber 1020 (arrow 1054C).

FIG. 8 further illustrates that the source generating a field in the passageway 1024 to produce plasma 1072C therein may include a source of high voltage (RF or DC with ballast resistor) supplied to the conductive vane 1060C and a conductor 1084 grounding the conductive body 1022C and forming the discharge zone between the vane 1070C and the reduced cross sectional area 1030C. For the structure, the high voltage may be selected to establish either a corona or glow discharge plasma. Functionally, a hot region (e.g. plasma 1072C) in the gas flow may create a significant drag to gas flow. In general, gas may tend to flow around the plasma region 1072C and along the walls of the body 1022C.

With the arrangement shown in FIG. 8 and described above, the pump(s) 1042 flow rate and regulated gas source 1034 flow rate may be adjusted such that gas from the chamber 13 of the device 12 flows into the intermediary chamber 1022 (arrow 1050) suppressing contaminant flow into the device 12 and gas flows from the aperture(s) 1032 through the open end 1026 of the elongated body 1022 and into the chamber 26 of the light source 20 (arrow 1052) establishing a counterflow for contaminant diffusion into the body 1022. In particular, these flows (arrows 1050 and 1052) may be achieved with gas in the chamber 26 of the light source 20 at a pressure $P_1$, gas in the chamber 13 of the device at a pressure $P_2$, with $P_1 > P_2$. In some cases, the pump(s) 1042 flow rate(s) and regulated gas source 1034 flow rate may be adjusted to direct flow from the passageway 1024 through the open end 1028 of the elongated body 1022 and into the intermediary chamber 1020 (arrow 1054). In some cases, the ion slowing buffer gas in chamber 26 may be about 200-600 mtorr (H2) and the pressure at the plane of the aperture(s) 1032 may exceed the chamber 26 pressure. At these pressure levels, the flow regime in the passageway 1024 may be viscous, allowing the gas flow rate (arrow 1054) from the intermediate focus 1018 to the intermediary chamber 1020 to be minimized by lengthening of the body 1022C. In addition, the pump(s) 1042 flow rate and regulated gas source 1034 flow rate may be adjusted relative to the pressures $P_1$ and $P_2$ to establish a pressure between the vane 1060C and the location 1030 at the reduced cross sectional area of which is suitable for an RF or DC plasma discharge.

With this arrangement, the plasma 1072 may function to reduce flow within passageway 1024 from the reduced cross sectional area 1030 toward the end 1028 of the elongated body 1022 and into the intermediary chamber 1020 (arrow 1054). As indicated above, increasing the resistance within the elongated body 1022 may allow for an increase in pressure in the plane of apertures 1032 thereby suppressing contaminant flow into the chamber 13, while maintaining flow in the direction of arrow 1050, and for a given pump 1042 speed.

Figure 9:
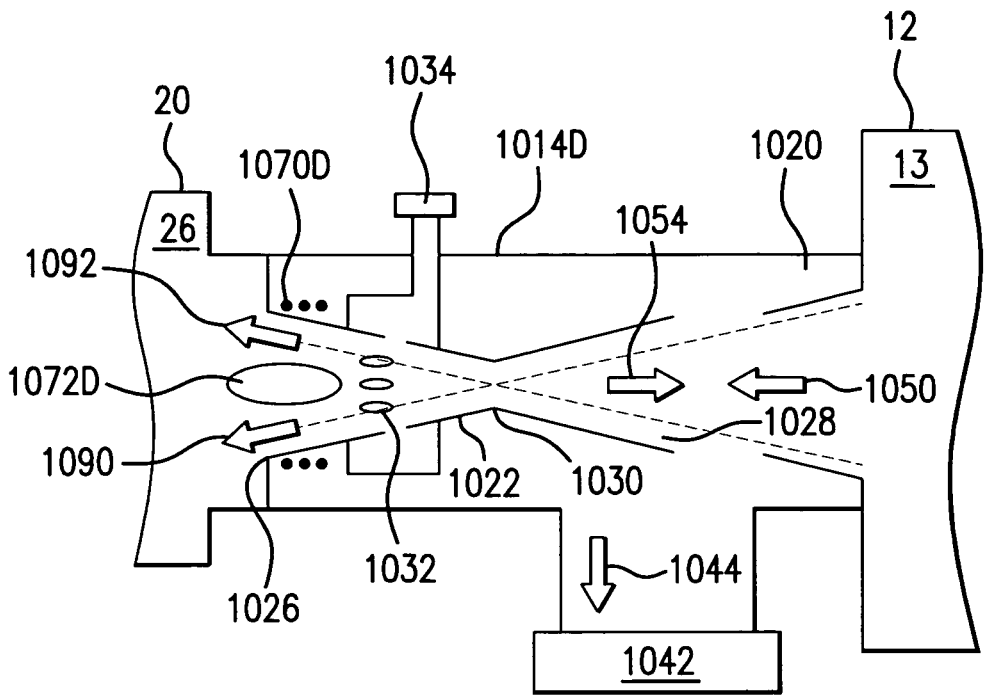
FIG. 9 shows another embodiment of a coupling system having a system for generating an inductively coupled plasma (ICP) within a flow passageway.

FIG. 9 shows another embodiment of a coupling system 1014D managing and/or limiting gas flow between the chamber 26 of a light source 20 and the chamber 13 of a device 12 while allowing EUV light to pass from the light source 20 into the device 12, the coupling system 1014D having one or more elements in common with the coupling system 1014 shown in FIG. 7.

For the coupling system 1014D shown, a wall surrounds an intermediary chamber 1020 that is in fluid communication with the chamber 13 of the device 12. The system 1014D may further include an elongated body 1022 restricting flow from the chamber 26 to the intermediary chamber 1020 and chamber 13 of the device 12. For the system 1014D, the body 1022 may be formed to at least partially surround a passageway 1024 and have a first open end 1026 allowing EUV light to enter the passageway 1024 from the chamber 26 and a second open end 1028 allowing EUV light to exit the passageway into the intermediary chamber 1020 and chamber 13 of the device 12. As shown, the body 1022 may be shaped, e.g. having a necked region, to establish at least one location 1030 having a reduced cross-sectional area relative to the ends 1026, 1028.

Continuing with FIG. 9, it can be seen that the body 1022 may be formed with one or more aperture(s) 1032, e.g. through-hole(s) and/or directional nozzle(s) extending through the wall of the body 1022, to allow gas to be introduced into the passageway 1024 at a position between the end 1026 of the body 1022 and the location 1030 having a reduced cross-sectional area. More specifically, as shown, gas, e.g. argon, hydrogen, helium, etc. from a regulated gas source 1034 may be caused to flow through aperture(s) 1032 and into passageway 1024.

FIG. 9 further shows that the coupling system 1014D may include a wall surrounding an intermediary chamber 1020 that includes a volume disposed between the open end of the body 1022 and the light input aperture of the device 12. For the coupling system 1014D shown, one or more pump(s) 1042 may be positioned to remove gas from the intermediary chamber 1020 and cause gas to flow in the direction of arrow 1044.

Continuing with FIG. 9, the coupling system 1014D may include a source 1070D generating an electromagnetic field in the passageway 1024 between the location 1030 having a reduced cross-sectional area and the end 1026 to produce a plasma 1072D therein. As shown, the source 1070D may comprise one or more radio-frequency (RF) coil(s) for creating an inductively coupled (ICP) discharge plasma 1072D in the passageway 1024. Functionally, a hot region (e.g. plasma 1072D) in the gas flow may create a significant drag to gas flow. In general, gas may tend to flow around the plasma region 1072D and along the walls of the body 1022. As indicated above, the suppression of contaminants from the chamber 26 into the passageway 1022, etc. may be increased by increasing the speed of gas flowing from the apertures 1032 and into the chamber 26. One way to increase this flow speed is to decrease the effective cross-section area of the passageway between the apertures 1032 and chamber 26, e.g. by producing a plasma in the region and forcing gas to flow along the walls of the body 1022.

For the arrangement shown, the walls of the body 1022 may be either non-conductive (e.g. made of ceramic, fused silica, etc.) or may be made of a conductive material (e.g. metal) with a slit (not shown) cut through the wall, e.g. from end 1026 to end 1028 and the slit sealed, e.g. with a non-conductive isolator insert (not shown).

With the arrangement shown in FIG. 9 and described above, the pump(s) 1042 flow rate and regulated gas source 1034 flow rate may be adjusted such that gas from the chamber 13 of the device 12 flows into the intermediary chamber 1022 (arrow 1050) suppressing contaminant flow into the device 12 and gas flows from the aperture(s) 1032 through the open end 1026 of the elongated body 1022 and into the chamber 26 of the light source 20 (arrow 1052) establishing a counterflow for contaminant diffusion into the body 1022. In particular, these flows (arrows 1050 and 1052) may be achieved with gas in the chamber 26 of the light source 20 at a pressure $P_1$, gas in the chamber 13 of the device at a pressure $P_2$, with $P_1 > P_2$. In some cases, the pump(s) 1042 flow rate(s) and regulated gas source 1034 flow rate may be adjusted to direct flow from the passageway 1024 through the open end 1028 of the elongated body 1022 and into the intermediary chamber 1020 (arrow 1054). In some cases, the ion slowing buffer gas in chamber 26 may be about 200-600 mtorr (H2) and the pressure at the plane of the aperture(s) 1032 may exceed the chamber 26 pressure. At these pressure levels, the flow regime in the passageway 1024 may be viscous, allowing the gas flow rate (arrow 1054) from the intermediate focus 1018 to the intermediary chamber 1020 to be minimized by lengthening of the body 1022. In addition, the pump(s) 1042 flow rate and regulated gas source 1034 flow rate may be adjusted relative to the pressures $P_1$ and $P_2$ to establish a pressure in the passageway 1024 between the aperture(s) 1032 and the open end 1026 suitable for an ICP discharge. The ionization may also be facilitated by EUV radiation which increases in intensity as it approaches the intermediate focus.

Figure 10:
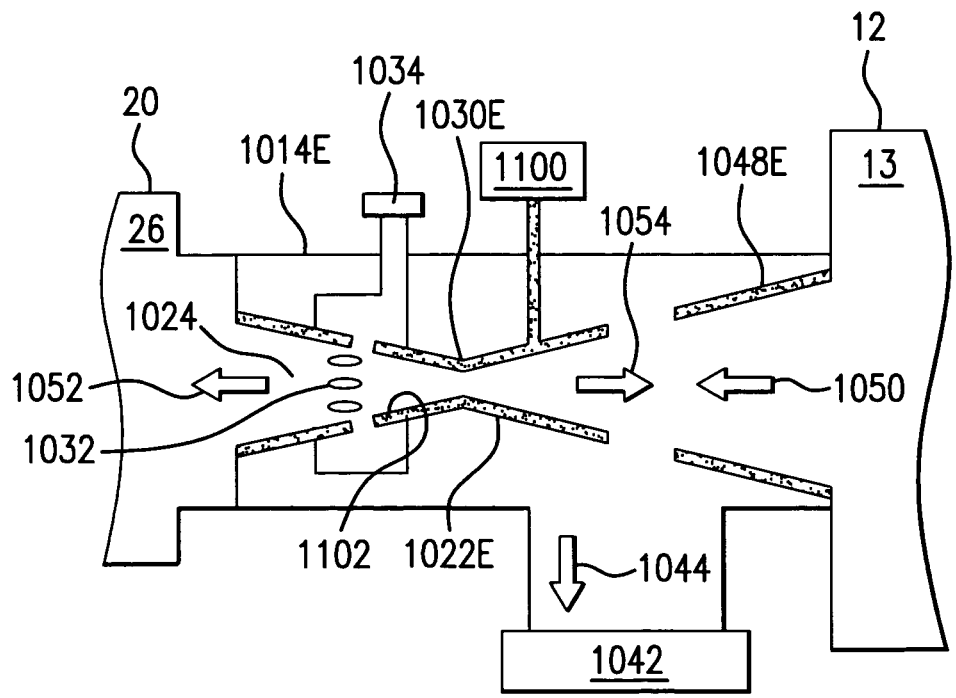
FIG. 10 shows another embodiment of a coupling system having a temperature control system for maintaining the temperature of all or portions of the elongated body surrounding a flow passageway within a predetermined range.

FIG. 10 shows another embodiment of a coupling system 1014E managing and/or limiting gas flow between the chamber 26 of a light source 20 and the chamber 13 of a device 12 while allowing EUV light to pass from the light source 20 into the device 12, the coupling system 1014E having one or more elements in common with the coupling system 1014 shown in FIG. 5.

For the coupling system 1014E shown, a wall surrounds an intermediary chamber 1020 that is in fluid communication with the chamber 13 of the device 12. The system 1014E may further include an elongated body 1022E restricting flow from the chamber 26 to the intermediary chamber 1020 and chamber 13 of the device 12. For the system 1014E, the body 1022E may be formed to at least partially surround passageway 1024A and have a first open end allowing EUV light to enter the passageway 1024A from the chamber 26 and a second open end allowing EUV light to exit the passageway into the intermediary chamber 1020 and chamber 13 of the device 12. As shown, the body 1022E may be shaped, e.g. having a necked region, to establish at least one location 1030 having a reduced cross-sectional area relative to the ends.

Continuing with FIG. 10, it can be seen that the body 1022E may be formed with one or more apertures 1032, e.g. through-hole(s) extending through the wall of the body 1022E, to allow gas to be introduced into the passageway 1024A at a position between the end of the body 1022E and the location 1030A having a reduced cross-sectional area. More specifically, as shown, gas, e.g. argon, hydrogen, helium, etc. from a regulated gas source 1034 may be caused to flow through aperture(s) 1032 and into passageway 1024.

FIG. 10 further shows that the coupling system 1014E may include a wall surrounding an intermediary chamber 1020 that includes a volume disposed between the open end of the body 1022E and the light input aperture of the device 12. For the coupling system 1014E shown, one or more pump(s) 1042 may be positioned to remove gas from the intermediary chamber 1020 and cause gas to flow in the direction of arrow 1044. With the arrangement shown in FIG. 10 and described above, the pump(s) 1042 flow rate and regulated gas source 1034 flow rate may be adjusted such that gas flows in the direction of arrows 1050, 1052 and in some cases 1054 and these flows may be achieved with gas in the chamber 26 of the light source 20 at a pressure $P_1$, gas in the chamber 13 of the device at a pressure $P_2$, with $P_1 > P_2$.

FIG. 10 also shows that a temperature control system 1100 may be provided maintaining the temperature of all or portions of the elongated body 1022E within a predetermined range. In particular, the temperature control system 1100 may cool all or portions of the inner surface 1102 of the body 1022E to below a preselected temperature to condense one or more contaminant species thereon, thereby preventing the contaminant species from entering the chamber 13 of the device 12.

As indicated above, the suppression factor for diffusion of contaminants (HBr, Sn vapor, Sn compounds) opposite to a gas flow is defined by the Pecklet number which is expressed by the formula: Pe=V*L/D, where V is average flow velocity in the suppression zone, L is the length of the suppression zone and D is diffusion coefficient of the contaminants in the gas. However, this approach does not consider the sticking of molecules to the walls 1102 of the body 1022E. If the sticking coefficient of the contaminants exceeds that of gas (e.g. $H_2$, He or Ar from source 1034), then the protection efficiency may be even better. In particular, contaminants such as HBr, $SnBr_2$, $SnBr_4$ have a vapor pressure much lower than the gas. Thus, the probability of condensation of the contaminants on the wall 1102 is much higher than that of gas. If the walls 1102 are cooled to low temperature (for example, using liquid nitrogen), most of the contaminants (including HBr) may be condensed on the walls. The walls 1102 may be cooled either by circulating a fluid (liquid N2 of other) within internal passageways formed in the body 1022E, as shown in FIG. 1, or, alternatively, Peltier elements (not shown) may be used. Cooling the walls 1102 may be applied to the whole length of the body 1022E as shown in FIG. 1, or, may be limited to selected portions such as portion between the apertures 1032 and end 1026. As further shown, cooling may be employed to reduce the surface temperature of the conical shroud 1048E extending from the device 12, to condense contaminants thereon.

The reader will quickly appreciate that the some or all of the embodiments described herein may be combined. For example, the temperature control system described herein may be used in conjunction with the vane as described with reference to FIG. 6 and/or the generation of a plasma as described with reference to FIG. 6, 7, 8 or 9.

Figure 11:
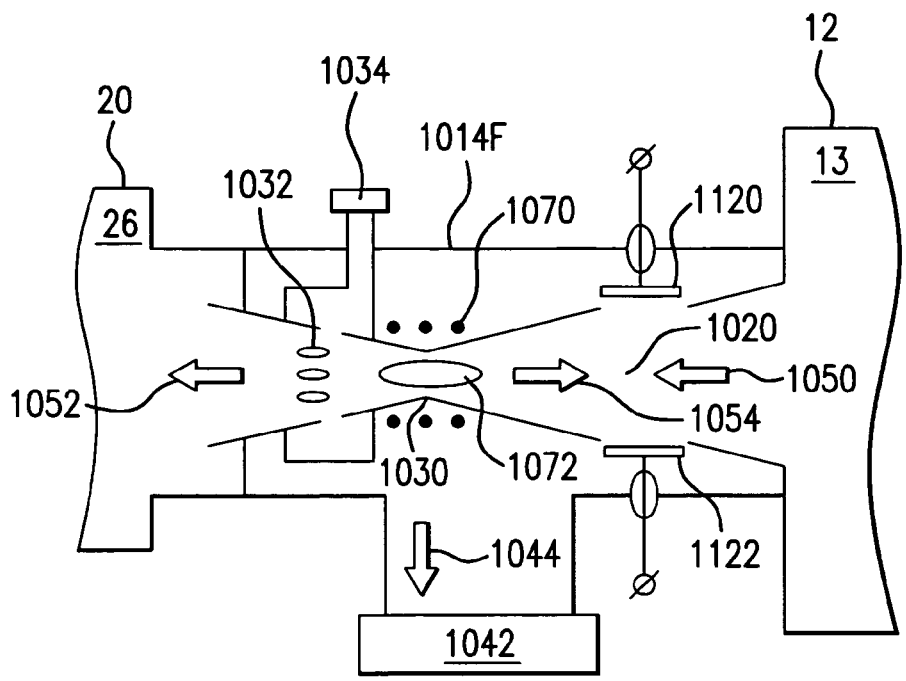
FIG. 11 shows another embodiment of a coupling system having system producing plasma in a flow passageway and a pair of electrodes generating an electric field deflect charged particles.

FIG. 11 shows another embodiment of a coupling system 1014F managing and/or limiting gas flow between the chamber 26 of a light source 20 and the chamber 13 of a device 12 while allowing EUV light to pass from the light source 20 into the device 12, the coupling system 1014F having one or more elements in common with the coupling system 1014B shown in FIG. 7.

For the coupling system 1014F shown, a wall surrounds an intermediary chamber 1020 that is in fluid communication with the chamber 13 of the device 12. The system 1014F may further include an elongated body 1022 restricting flow from the chamber 26 to the intermediary chamber 1020 and chamber 13 of the device 12. For the system 1014F, the body 1022 may be formed to at least partially surround a passageway 1024 and have a first open end 1026 allowing EUV light to enter the passageway 1024 from the chamber 26 and a second open end 1028 allowing EUV light to exit the passageway into the intermediary chamber 1020 and chamber 13 of the device 12. As shown, the body 1022 may be shaped, e.g. having a necked region, to establish at least one location 1030 having a reduced cross-sectional area relative to the ends.

Continuing with FIG. 11, it can be seen that the body 1022 may be formed with one or more aperture(s) 1032, e.g. through-hole(s) and/or directional nozzle(s) extending through the wall of the body 1022, to allow gas to be introduced into the passageway 1024 at a position between the end of the body 1022 and the location 1030 having a reduced cross-sectional area. More specifically, as shown, gas, e.g. argon, hydrogen, helium, etc. from a regulated gas source 1034 may be caused to flow through aperture(s) 1032 and into passageway 1024.

FIG. 11 further shows that the coupling system 1014F may include a wall surrounding an intermediary chamber 1020 that includes a volume disposed between the open end of the body 1022 and the light input aperture of the device 12. For the coupling system 1014F shown, one or more pump(s) 1042 may be positioned to remove gas from the intermediary chamber 1020 and cause gas to flow in the direction of arrow 1044.

Continuing with FIG. 11, the coupling system 1014F may include a source 1070 generating an electromagnetic field in the passageway 1024 at or near the location 1030 having a reduced cross-sectional area to produce a plasma 1072 therein. As shown, the source 1070 may comprise one or more radio-frequency (RF) coil(s) for creating an inductively coupled (ICP) discharge plasma 1072 in the passageway 1024. Functionally, a hot region (e.g. plasma 1072) in the gas flow may create a significant drag to gas flow. In general, gas may tend to flow around the plasma region 1072 and along the walls of the body 1022. For the arrangement shown, the walls of the body 1022 may be either non-conductive (e.g. made of ceramic, fused silica, etc.) or may be made of a conductive material (e.g. metal) with a slit (not shown) cut through the wall, e.g. from end 1026 to end 1028 and the slit sealed, e.g. with a non-conductive isolator insert (not shown).

With the arrangement shown in FIG. 11 and described above, the pump(s) 1042 flow rate and regulated gas source 1034 flow rate may be adjusted such that gas from the chamber 13 of the device 12 flows into the intermediary chamber 1022 (arrow 1050) suppressing contaminant flow into the device 12 and gas flows from the aperture(s) 1032 through the open end 1026 of the elongated body 1022 and into the chamber 26 of the light source 20 (arrow 1052) establishing a counterflow for contaminant diffusion into the body 1022. In particular, these flows (arrows 1050 and 1052) may be achieved with gas in the chamber 26 of the light source 20 at a pressure $P_1$, gas in the chamber 13 of the device at a pressure $P_2$, with $P_1 > P_2$. In some cases, the pump(s) 1042 flow rate(s) and regulated gas source 1034 flow rate may be adjusted to direct flow from the passageway 1024 through the open end 1028 of the elongated body 1022 and into the intermediary chamber 1020 (arrow 1054). In some cases, the ion slowing buffer gas in chamber 26 may be about 200-600 mtorr (H2) and the pressure at the plane of the aperture(s) 1032 may exceed the chamber 26 pressure. At these pressure levels, the flow regime in the passageway 1024 may be viscous, allowing the gas flow rate (arrow 1054) from the intermediate focus 1018 to the intermediary chamber 1020 to be minimized by lengthening of the body 1022. In addition, the pump(s) 1042 flow rate and regulated gas source 1034 flow rate may be adjusted relative to the pressures $P_1$ and $P_2$ to establish a pressure in the location 1030 at the reduced cross sectional area of about 0.5-1 torr which is suitable for an ICP discharge. The ionization may also be facilitated by EUV radiation which has maximum intensity at the intermediate focus.

With this arrangement, the plasma 1072 may function to reduce flow within passageway 1024 from the reduced cross sectional area 1030 toward the end 1028 of the elongated body 1022 and into the intermediary chamber 1020 (arrow 1054). As indicated above, increasing the resistance within the elongated body 1022 may allow for an increase in pressure in the plane of apertures 1032 thereby suppressing contaminant flow into the chamber 13, while maintaining flow in the direction of arrow 1050, and for a given pump 1042 speed.

FIG. 11 further shows that the coupling system 1014F may include a pair of electrodes 1120, 1122 for generating an electromagnetic field, e.g. a uniform electric field, within a portion of the intermediary chamber 1020 to deflect charged particles that are flowing in the intermediary chamber 1020 toward the input to the device 12 and thereby prevent the charged particles from entering the device 12. In general, a small fraction of contaminants may diffuse through the counter flow (arrow 1052) and pass through the plasma 1072 and into the intermediary chamber 1020 where they may be partially stopped by the gas flow from scanner. Some or all of the contaminants may be charged, e.g. by electron attachment due to high electro-negative properties (e.g. HBr) or by ionization due to low ionization potential compare to carrier gas (e.g. Sn, $SnBr_x$) after passing the plasma region. Typically, the degree of charging of the contaminants will be higher than that of carrier gas. When the charged contaminants arrive at the intermediary chamber 1020, the charged particles may be deflected away from the input aperture of the device 12 by the electric field. In some cases, the IF region may be maintained at a relatively low pressure (~10 mtorr), e.g. by adjusting the pump 1042 and regulated gas source 1034, where the mean free path is about 1 cm, thus deflection may not be substantially affected by the low pressure barrier gas. When the charged contaminant particles hit electrodes, they will be neutralized and may be pumped away by the pumps together with barrier gas, since the contaminants were removed already from the direct flow into the device 12.

The reader will quickly appreciate that the some or all of the embodiments described herein may be combined. For example, the charged-particle deflecting system described herein may be used in conjunction with the vane as described with reference to FIG. 6, the generation of a plasma as described with reference to FIG. 6, 7, 8 or 9 and/or temperature control system as described with reference to FIG. 10.

Figure 12:
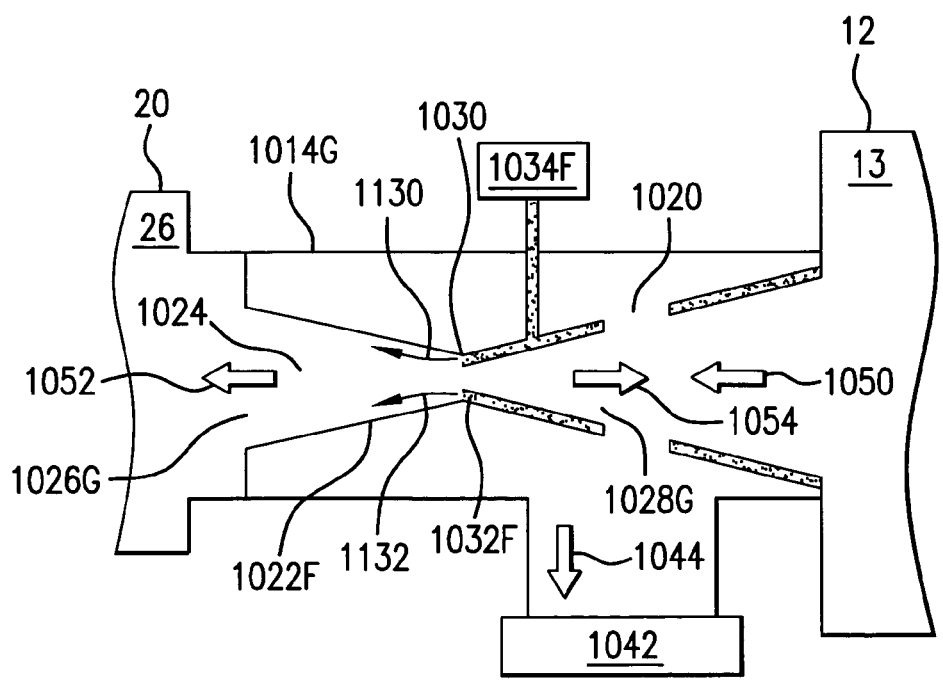
FIG. 12 shows another embodiment of a coupling system configured to allow gas to be introduced into a passageway directed toward the end of the passageway.

FIG. 12 shows another embodiment of a coupling system 1014G managing and/or limiting gas flow between the chamber 26 of a light source 20 and the chamber 13 of a device 12 while allowing EEV light to pass from the light source 20 into the device 12, the coupling system 1014G having one or more elements in common with the coupling system 1014 shown in FIG. 5.

For the coupling system 1014G shown, a wall surrounds an intermediary chamber 1020 that is in fluid communication with the chamber 13 of the device 12. The system 1014G may further include an elongated body 1022G restricting flow from the chamber 26 to the intermediary chamber 1020 and chamber 13 of the device 12. For the system 1014G, the body 1022G may be formed to at least partially surround a passageway 1024 and have a first open end allowing EUV light to enter the passageway 1024 from the chamber 26 and a second open end allowing EUV light to exit the passageway into the intermediary chamber 1020 and chamber 13 of the device 12. As shown, the body 1022G may be shaped, e.g. having a necked region, to establish at least one location 1030 having a reduced cross-sectional area relative to the ends.

Continuing with FIG. 12, it can be seen that the body 1022G may be formed with one or more aperture(s) 1032F to allow gas to be introduced into the passageway 1024 and directed toward the end 1026 of the body 1022 arrows 1130, 1132. More specifically, as shown, gas, e.g. argon, hydrogen, helium, etc. from a regulated gas source 1034 may be caused to flow through aperture(s) 1032 and into passageway 1024. For the coupling system 1014G shown, the aperture(s) may be located at or near the intermediate focus, at or near the location 1030 having a reduced cross-sectional area, between the end 1026G and location 1030 having a reduced cross-sectional area, or between the end 1028G and location 1030 having a reduced cross-sectional area.

FIG. 12 further shows that the coupling system 1014G may include a wall surrounding an intermediary chamber 1020 that includes a volume disposed between the open end of the body 1022G and the light input aperture of the device 12. For the coupling system 1014G shown, one or more pump(s) 1042 may be positioned to remove gas from the intermediary chamber 1020 and cause gas to flow in the direction of arrow 1044.

With the arrangement shown in FIG. 12 and described above, the pump(s) 1042 flow rate and regulated gas source 1034 flow rate may be adjusted such that gas from the chamber 13 of the device 12 flows into the intermediary chamber 1022G (arrow 1050) suppressing contaminant flow into the device 12 and gas flows from the aperture(s) 1032 through the open end 1026 of the elongated body 1022G and into the chamber 26 of the light source 20 (arrow 1052) establishing a counterflow for contaminant diffusion into the body 1022G. In particular, these flows (arrows 1050 and 1052) may be achieved with gas in the chamber 26 of the light source 20 at a pressure $P_1$, gas in the chamber 13 of the device at a pressure $P_2$, with $P_1 > P_2$. In some cases, the pump(s) 1042 flow rate(s) and regulated gas source 1034 flow rate may be adjusted to direct flow from the passageway 1024 through the open end 1028 of the elongated body 1022G and into the intermediary chamber 1020 (arrow 1054). In some cases, the ion slowing buffer gas in chamber 26 may be about 200-600 mtorr (H2) and the pressure at the plane of the aperture(s) 1032 may exceed the chamber 26 pressure. At these pressure levels, the flow regime in the passageway 1024 may be viscous, allowing the gas flow rate (arrow 1054) from the intermediate focus 1018 to the intermediary chamber 1020 to be minimized by lengthening of the body 1022G.

The reader will quickly appreciate that the some or all of the embodiments described herein may be combined. For example, the directed flow system described herein may be used in conjunction with the vane as described with reference to FIG. 6, the generation of a plasma as described with reference to FIG. 6, 7, 8 or 9, temperature control system as described with reference to FIG. 10 and/or charged-particle deflecting system as described with reference to FIG. 11.

While the particular embodiment(s) described and illustrated in this patent application in the detail required to satisfy 35 U.S.C. §112 are fully capable of attaining one or more of the above-described purposes for, problems to be solved by, or any other reasons for or objects of the embodiment(s) above described, it is to be understood by those skilled in the art that the above-described embodiment(s) are merely exemplary, illustrative and representative of the subject matter which is broadly contemplated by the present application. Reference to an element in the following Claims in the singular is not intended to mean nor shall it mean in interpreting such Claim element "one and only one" unless explicitly so stated, but rather "one or more". All structural and functional equivalents to any of the elements of the above-described embodiment(s) that are known or later come to be known to those of ordinary skill in the art are expressly incorporated herein by reference and are intended to be encompassed by the present Claims. Any term used in the Specification and/or in the Claims and expressly given a meaning in the Specification and/or Claims in the present Application shall have that meaning, regardless of any dictionary or other commonly used meaning for such a term. It is not intended or necessary for a device or method discussed in the Specification as an embodiment to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

What is claimed is:

1. A flow management system for an extreme ultraviolet lithography apparatus, the system comprising:
 a first enclosing wall at least partially surrounding a first space;
 a system generating plasma in said first space, the plasma emitting extreme ultraviolet light;
 a second enclosing wall at least partially surrounding a second space;
 an elongated body at least partially surrounding a passageway and having a first open end allowing EUV light to enter the passageway from the first space and a second open end allowing EUV light to exit the passageway into the second space, the body having a shape establishing a location having a reduced cross-sectional area relative to the first and second ends, the passageway establishing fluid communication between said first and second spaces, said second space otherwise sealed from said first space; and
 a flow of gas exiting an aperture, the aperture positioned to introduce gas into the passageway at a position between the first end of the body and the location having a reduced cross-sectional area.

2. A system as recited in claim 1 further comprising a source for generating an electromagnetic field in said passageway to produce a plasma therein.

3. A system as recited in claim 2 further comprising a pair of electrodes for establishing an electric field in the second space to deflect charged particles.

4. A system as recited in claim 2 wherein said source comprises a radio-frequency coil for creating an inductively coupled discharge plasma in said passageway.

5. A system as recited in claim 2 wherein said source produces a direct current electrode discharge in said passageway.

6. A system as recited in claim 5 wherein said electrode discharge is a glow discharge.

7. A system as recited in claim 5 wherein said electrode discharge is a corona discharge.

8. A system as recited in claim 2 wherein said source produces a radio-frequency electrode discharge in said passageway.

9. A system as recited in claim 8 wherein said electrode discharge is a glow discharge.

10. A system as recited in claim 8 wherein said electrode discharge is a corona discharge.

11. A system as recited in claim 1 wherein the aperture comprises a hole formed in the elongated body.

12. A system as recited in claim 1 further comprising a temperature control system maintaining the temperature of the elongated body within a predetermined range.

13. A system as recited in claim 1 further comprising at least one vane disposed in the passageway of the elongated body.

14. A system as recited in claim 1 wherein the system comprises a plurality of apertures, each aperture positioned to introduce gas into the passageway at a respective position between the first end of the body and the location having reduced cross-sectional area.

15. A system as recited in claim 1 wherein the system comprises a nozzle directing flow from the aperture toward the first end of the elongated body.

16. An extreme ultraviolet lithography apparatus comprising:
a first chamber having gas disposed therein;
a second chamber having gas disposed therein;
an intermediary chamber in fluid communication with the second chamber;
an elongated body restricting flow from the first chamber to the intermediary chamber, the body at least partially surrounding a passageway and having a first open end allowing EUV light to enter the passageway and a second open end allowing EUV light to exit the passageway;
a flow of gas exiting an aperture, the aperture positioned to introduce gas into the passageway at a location between the first end and the second end of the body; and
a pump removing gas from the intermediary chamber.

17. An extreme ultraviolet lithography apparatus as recited in claim 16 wherein the pump cooperates with the flow of gas exiting the aperture and the operational pressures within the first and second chambers to establish a gas flow directed from the second chamber into the intermediary chamber and a gas flow from the aperture through the first open end of the elongated body and into the first chamber.

18. An apparatus comprising:
a first enclosing structure surrounding a first volume;
a system generating a plasma at a plasma site in the first volume, the plasma producing EUV radiation and ions exiting the plasma;
an optic positioned in the first volume and distanced from the site by a distance, d;
a gas disposed between the plasma site and optic, the gas establishing a gas number density sufficient to operate over the distance, d, to reduce ion energy below 100 eV before the ions reach the optic; and
a second enclosing structure surrounding a second volume,
a system coupling the second volume to the first volume to allow EUV radiation to pass from the first volume to the second volume and operable to establish a gas flow directed from the second volume into the system and a gas flow from the system into the first volume.

19. An apparatus as recited in claim 18 wherein a gas is disposed in the first volume at a pressure $P_1$ and a gas is disposed in the second volume at a pressure $P_2$, with $P_1 > P_2$.

20. An apparatus as recited in claim 18 wherein the system comprises:
an intermediary chamber in fluid communication with the second volume;
an elongated body restricting flow from the first volume to the intermediary chamber, the body at least partially surrounding a passageway and having a first open end allowing EUV light to enter the passageway and a second open end allowing EUV light to exit the passageway;
a flow of gas exiting an aperture, the aperture positioned to introduce gas into the passageway at a position between the first end and the second end of the body; and
a pump removing gas from the intermediary chamber.

21. An apparatus as recited in claim 18 further comprising a multi-channel structure disposed in said first volume.

* * * * *